US012701738B2

(12) United States Patent
　　Mehrotra

(10) Patent No.: US 12,701,738 B2
(45) Date of Patent: Aug. 4, 2026

(54) LATERAL FIN FIELD-EFFECT TRANSISTORS

(71) Applicant: TEXAS INSTRUMENTS INCORPORATED, Dallas, TX (US)

(72) Inventor: Manoj Mehrotra, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 350 days.

(21) Appl. No.: 17/128,545

(22) Filed: Dec. 21, 2020

(65) Prior Publication Data

US 2022/0199828 A1　　Jun. 23, 2022

(51) Int. Cl.
| | |
|---|---|
| *H10D 30/62* | (2025.01) |
| *H10D 30/65* | (2025.01) |
| *H10D 84/01* | (2026.01) |
| *H10D 84/03* | (2025.01) |
| *H10D 84/83* | (2025.01) |

(52) U.S. Cl.
CPC ......... *H10D 30/6217* (2025.01); *H10D 30/65* (2025.01); *H10D 84/0158* (2025.01); *H10D 84/038* (2025.01); *H10D 84/834* (2025.01)

(58) Field of Classification Search
CPC ............. H01L 29/7856; H01L 29/7816; H01L 21/823431; H01L 27/0886; H10D 30/6217; H10D 30/65; H10D 84/0158; H10D 84/834; H10D 84/038
See application file for complete search history.

(56) References Cited

U.S. PATENT DOCUMENTS

| | | | | |
|---|---|---|---|---|
| 2014/0319610 A1* | 10/2014 | Mauder | ................ | H10D 62/127 |
| | | | | 438/286 |
| 2021/0028312 A1* | 1/2021 | Drowley | ........... | H01L 29/66462 |
| 2021/0305404 A1* | 9/2021 | Drowley | ........... | H01L 29/66462 |
| 2021/0407815 A1* | 12/2021 | Chen | ................... | H01L 29/1066 |
| 2022/0020743 A1* | 1/2022 | Drowley | ............. | H01L 29/7851 |
| 2022/0123129 A1* | 4/2022 | Chuang | ............... | H01L 21/2652 |
| 2022/0123130 A1* | 4/2022 | Chuang | ............. | H01L 29/66803 |

* cited by examiner

*Primary Examiner* — Christine A Enad
(74) *Attorney, Agent, or Firm* — Andrew R. Ralston; Frank D. Cimino

(57) ABSTRACT

In a described example, an integrated circuit includes a substrate of a semiconductor material, a source region, a gate region, a drain region and a fin structure formed on the substrate. The fin structure includes the gate region, the source region and a drift region between the gate region and the drain region. A doped control layer is formed along at least one sidewall of the fin structure over the drift region.

26 Claims, 21 Drawing Sheets

200

202 — FORM BURIED DOPED LAYER

204 — FORM FIN STRUCTURE

206 — FORM DIELECTRIC LAYER

207 — FORM CHANNEL, FIELD AND DRIFT REGIONS

208 — FORM DOPED CONTROL LAYER ALONG FIN

210 — FORM GATE STRUCTURE

212 — FORM SOURCE REGION

214 — FORM DRAIN REGION

216 — FORM SPACERS

218 — SOURCE/DRAIN IMPLANT

220 — BACK END OF LINE PROCESSING

A-A

302

106   N-

108   PBL

106   N-

100

B-B

302

106   N-

108   PBL     132

106   N-

100

LATERAL FIN FIELD-EFFECT TRANSISTORS

TECHNICAL FIELD

This description relates to transistors and methods of making fin-type transistors including one or more doped control layers for junction control.

BACKGROUND

A laterally-diffused metal-oxide semiconductor (LD-MOS) transistor is a planar double-diffused metal oxide semiconductor field effect transistor (MOSFET). Planar LDMOS transistors have double diffused junctions forming channel region and a drift region (separating the drain region from the source and channel regions) and are designed to support higher breakdown voltages. With such construction, it tends to be difficult to make LDMOS transistors having both low turn on-resistance while also having a sufficiently high breakdown voltage, such as for high-power applications. This is because of trade-off between turn-on resistance and breakdown voltage for LDMOS transistors.

SUMMARY

In a described example, an integrated circuit includes a substrate of a semiconductor material, a source region, a gate region, a drain region and a fin structure formed on the substrate. The fin structure includes the gate region, the source region and a drift region between the gate region and the drain region. A doped control layer is formed along at least one sidewall of the fin structure over the drift region.

In another described example, an integrated circuit includes a fin structure formed on a semiconductor substrate. The fin structure includes a fin transistor that includes drain and source regions formed in the fin structure. A gate region is formed in the fin structure between the source and drain regions. A channel region is formed between the source and gate regions. A drift region is formed in the fin structure extending from the channel region to the drain region. A buried doped layer is formed in the substrate extending beneath at least a portion of the drift region.

A further described example relates to a method of making a fin transistor. The method includes forming a fin structure on a surface of a substrate. The method also includes forming a drift region in the fin structure extending from a channel region to a drain region of the fin transistor. A doped control layer is formed adjacent the drift region of the fin structure. The doped control layer extends over and/or beneath at least at least a portion of drift region.

DETAILED DESCRIPTION

Example embodiments relate to transistors and integrated circuits that include one or more fin-based transistors (also referred to herein as fin transistors). In an example, the fin transistor is formed as a three-dimensional lateral diffused metal oxide semiconductors (LDMOS) transistor. Other types of transistors may also benefit from the approach described herein. One or more doped control layers are formed within or adjacent the fin structure to implement junction control for a drift region formed in the fin structure. The drift region usually has lower dopant concentration than the drain region to support higher breakdown voltages needed in many high-power applications. However, this tends to increase the series resistance to the current flow during on-state conduction as well as to degrade radio frequency (RF) performance of existing LDMOS transistors. As described herein, fin transistor includes one or more doped control layer to control the potential in the drift region of the fin transistor. The use of one or more doped control layers thus enables use of higher net doping in the drift region (compared to existing transistors) which lowers the resistance of the drift region to current flow to during conduction. As a result, the doped control layer can improve performance of the fin transistor by reducing the turn-on resistance while maintaining a high breakdown voltage to meet design specifications.

As an example, a fin transistor includes gate, source and drain regions formed on and/or in a semiconductor substrate. The fin transistor also includes a fin structure formed on the substrate. The fin structure can include the gate region, the source region and a drift region between a channel and the drain region. The channel may be formed in the fin structure between the gate and source regions. The fin transistor also includes a doped control layer to control potential distribution along the drift region of the fin structure between the gate and drain. In one example, the doped control layer is formed on the fin structure, such as a doped region formed along one or more sides of the fin. In another example, the doped control layer is implemented as a buried doped layer formed in the substrate adjacent the drift region. In still another example, the fin transistor includes more than one doped control layer, such as a doped control layer along one or more sides of the fin and a buried doped layer in the substrate. The dimensions and/or geometry of each respective doped control layer or layers can be a configurable design parameter to control the turn-on resistance and breakdown voltage of the fin transistor.

Figure 1:
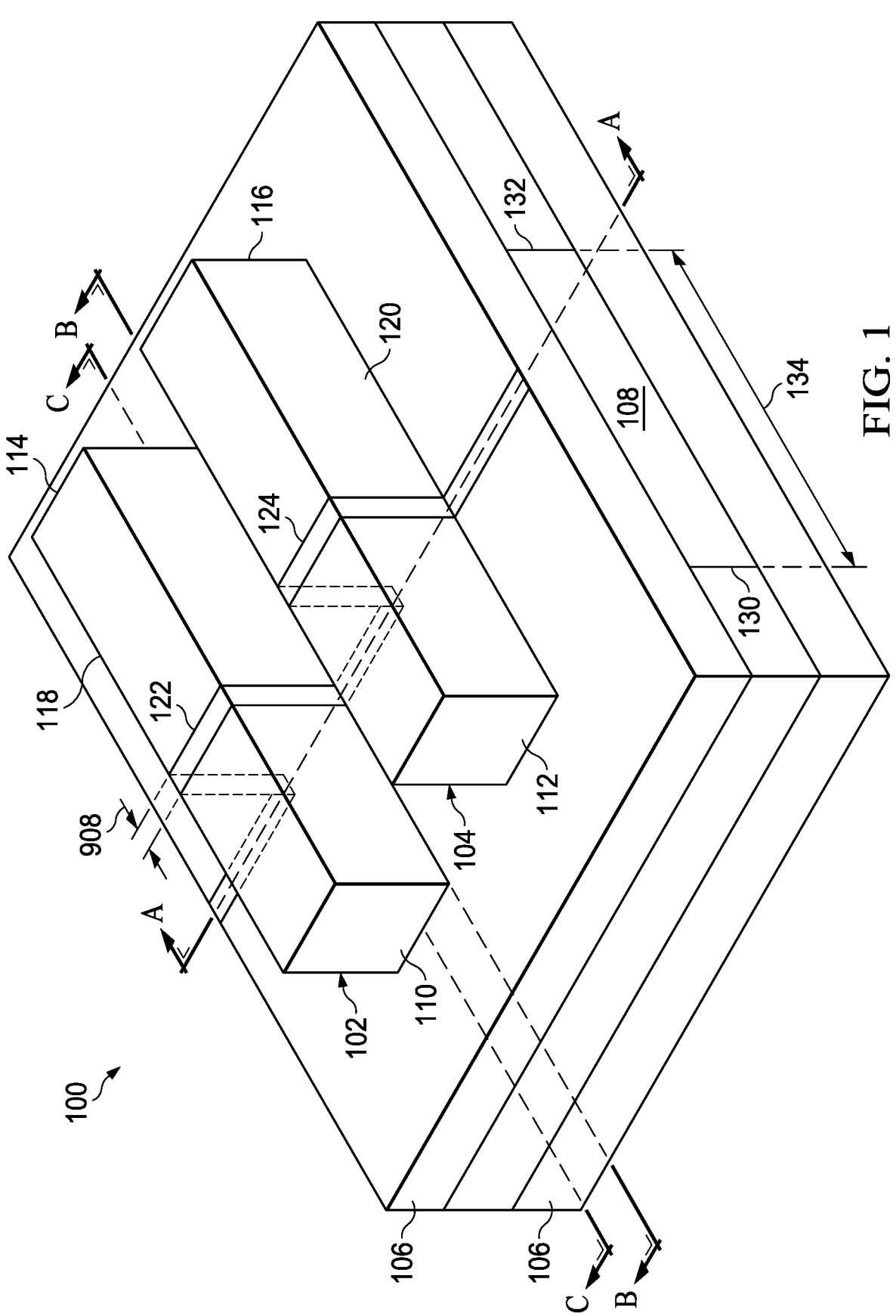
FIG. 1 is an isometric view of a fin transistor being formed on a substrate.

FIG. 1 depicts an example of an IC 100 being fabricated to include one or more doped control layers configured to control potential distribution for a drift region of a respective fin transistor. The example of FIG. 1 shows multiple (e.g., two) fin structures (also referred to herein as "fins") 102 and 104 formed on a substrate 106 of a semiconductor material. The substrate 106 may be bulk silicon, silicon on insulator (SOI), silicon-germanium, gallium arsenide or the like. A buried doped layer 108 is also formed in the substrate 106. In examples in which the substrate is N-type, the buried layer 108 may be P-type and may be referred to herein without implied limitation as P-buried layer 108 or PBL 108. In an example, the semiconductor substrate 106 may be implanted with a dopant and annealed to form the buried doped layer 108. In another example, the substrate 106 may be epitaxially grown after doped layer formation resulting in the buried doped layer beneath the substrate surface. The buried doped layer may extend throughout the entire substrate 106. In other examples, the size of the buried doped layer may be controlled (e.g., by patterning) so that the buried doped layer extends under a portion of the respective fins 102 and 104. In other examples, the buried doped layer 108 may be omitted from the fin transistor.

In the example of FIG. 1, two fins 102 and 104 are shown formed on the substrate 106. In other examples, any number of fins may be formed on the substrate 106. Respective fin transistors may be formed on the IC 100 with each of the fins 102, 104. Additionally, while the fins 102, 104 are shown as having a rectangular cross-sectional shape, other cross-sectional shapes, relative sizes and geometries may be utilized to form a fin transistor.

The fins 102, 104 include respective first ends 110, 112 and respective second ends 114, 116 spaced apart from each other by corresponding elongated sidewalls 118, 120. The sidewalls 118, 120 have opposing side surfaces and a top surface extending between the opposing side surfaces. In the example of FIG. 1, a doped control layer 122, 124 is formed on each respective fins 102, 104 to provide a diffused boundary junction along the respective fin sidewalls 118, 120. For example, the doped control layer 122, 124 may be formed by patterning and implanting a dopant species along a portion of the sidewall 118, 120 of respective fins 102, 104. In one example, the doped control layer 122, 124 may be formed as a continuous doped shallow region along all three sidewalls of the fin 102, 104. In another example, the doped control layer may be formed on opposing spaced apart (lateral) sidewalls of the fin 102, 104, such as by using a dopant blocking dielectric layer at the top during the doping process (see, e.g., FIG. 27). The doped control layers 122, 124 may have the same configuration for each fin 102, 104, such as shown in the example of FIG. 1. In another example, the doped control layers 122, 124 may each have different configurations or be formed on different portions of the respective fins 102, 104.

In an example, the fin transistor may include multiple doped control layers, including both the buried doped layer 108 and the doped control layer 122, 124 along the sidewalls of respective fins 102, 104 to perform potential control along the drift region of the fin transistor. When both the doped control layers 122, 124 and the buried doped layer 108 are implemented for junction control, a spatial overlap between the buried doped layer 108 and respective doped control layers 122, 124 may be configurable to establish electrical operating parameters of the fin transistor. In one example, the buried doped layer 108 extends from a first end 130 in the longitudinal direction of the respective fins 102, 104 and terminates in a second end 132. In an example, the buried doped layer 108 may have a length 134 such that the second end 132 of the buried doped layer 108 has a longitudinal position that is directly beneath and overlaps with the doped control layer 122, 124. In another example, the buried doped layer 108 may extend beneath the entire fin 102, 104 such that the ends 130 and 132 are located beyond the respective ends 114, 116 of the fins 102, 104. The geometry and/or doping of the buried doped layer 108 and doped control layers 122, 124 thus may be configured according to electrical operating requirements of the devices being formed on the IC 100.

As a further example, the doped control layers 122, 124 may include multiple doped regions can be distributed along the length of the respective fins 102, 104 between respective fin ends 110, 112 and 114, 116. Each doped control layer 122, 124 along the respective fins 102, 104 may be formed with different amounts and/or types of dopants, geometries and spacing between adjacent regions, which may be configured by using one or more masks during implantation. In some examples, the doped control layers 122, 124 along the fins 102, 104 may be omitted from the fin transistors and another doped control layer, such as buried doped layer 108, is provided to control potential along the drift region of the fin transistor.

As described herein, the doped control layer 122, 124 and/or buried doped layer 108 forms a junction region to control potential distribution along the fins 102, 104 between the gate and drain of the respective fin transistor. In an example, the doped control layers 122, 124 and/or buried doped layer 108 are floating (e.g., not coupled to a bias source) to provide for passive control of potential along the drift region of respective fin transistors. In another example, the doped control layers 122, 124 and/or buried doped layer 108 may be adapted to be coupled to a bias voltage source. The fin transistors may include one or more respective contacts coupled to respective doped control layers. The contacts may be coupled to the bias voltage source. The bias voltage source may be a dedicated voltage source or a voltage source that is provided to a terminal that is formed on respective fin transistors. In an example, a doped control layer contact is coupled (e.g., through a trace or resistive connection) to a source contact, which is coupled to the source region of the fin transistor. In an example where the doped control layer 122, 124 and the buried doped layer 108 are coupled together within the semiconductor substrate 106, the doped control layers 122 and 124 may be connected to a bias voltage source through a contact that is coupled to the buried doped layer 108.

The IC 100 shown in FIG. 1 may be used as a basic structure at an intermediate fabrication step to form a fin transistor (e.g., an N-type fin transistor or a P-type fin transistor) having gate, source and drain regions. As described herein, the one or more doped control layers 122, 124 and/or 108, provide the ability to modulate the resistance of the drift region of the fin transistor. This ability may provide the fin transistor with improved turn-on resistance (drain-to-source resistance in the on-state) and breakdown voltage (a maximum voltage that can be supported across the source/drain without causing device failure). Accordingly, fin transistors constructed as described herein are examples of FETs useful for high power applications.

Figure 2:
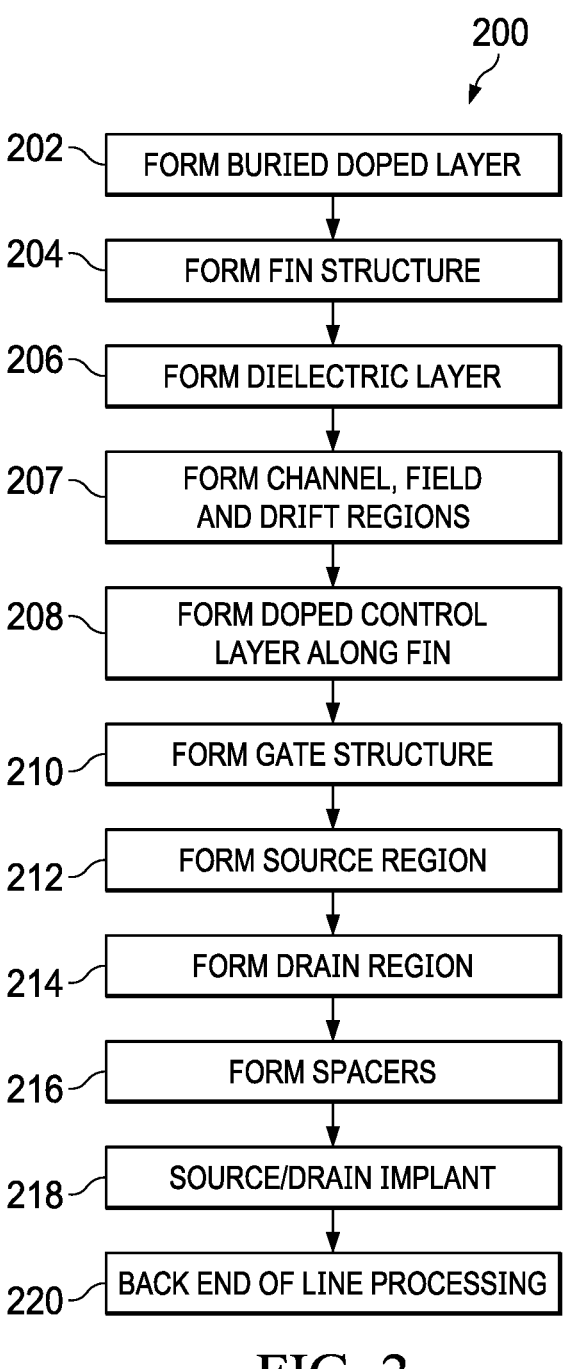
FIG. 2 is a flow diagram depicting an example method for making a fin transistor.

An example method 200 for forming one or more fin transistors is illustrated in FIG. 2. While the actions described in the method 200 are presented in the illustrated order, the disclosure contemplates implementing the described actions in different orders consistent with the constraints of semiconductor device manufacturing. FIGS. 3-26 show various views of the example transistors at various stages of fabrication according to the method 200. For ease of explanation, FIGS. 3-26 show different views of the structure being fabricated taken in directions along lines A-A, B-B and C-C in FIG. 1 and along lines D-D and E-E in FIG. 14 at respective stages of fabrication. Thus, even though some intermediate structures represent the transistor being formed before fin formation, views along lines A-A and D-D are transverse to a longitudinal direction of the fins and lines B-B, C-C and E-E are parallel to the longitudinal directions of the fins.

Figures 3, 4:
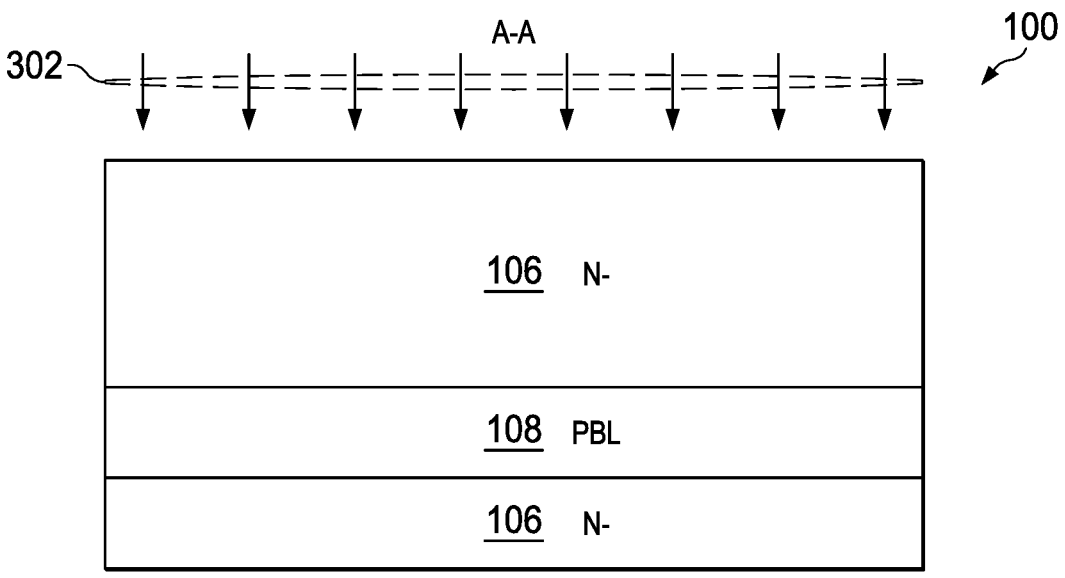
FIGS. 3 and 4 are cross-sectional views of a buried doped layer being formed in a substrate for an example fin transistor.

The method 200 begins at 202 in which a buried doped layer 108 is formed. For example, as shown in FIG. 3 (taken in the direction along line A-A of FIG. 1 prior to fin formation) and FIG. 4 (taken in the direction along line B-B of FIG. 1 prior to fin formation), the buried doped layer 108 is formed in the substrate. The buried doped layer 108 may be formed by a dopant implant 302 that implants a dopant species into the substrate followed by epitaxial growth of silicon layer. For example, the dopant species may be a P-type dopant (e.g., boron, indium or other p-type dopant species) when forming an N-type fin transistor, or an N-type dopant (e.g., phosphorous, antimony, arsenic or other n-type dopant species) when forming a P-type fin transistor. As described herein, the buried doped layer 108 may extend completely through the substrate 106 so that the buried doped layer 108 is located and extends completely beneath the fin that is being formed. In other examples, the formation of geometry of buried doped layer may be constrained (e.g., by implanting dopants through mask) so that the buried doped layer does not extend completely through the substrate, but has the end 132 located at an intermediate location in the substrate 106. In an example, the location of the end 132 of buried doped layer 108 may be aligned with a gate region of the fin transistor being formed. In another example, the buried doped layer 108 may extend into the substrate (along the line B-B of FIG. 1) so that the end 132 aligns with an intermediate location along the fin being formed. Thus, the length of the buried doped layer 108 may range from zero (meaning the buried doped layer is omitted from the IC 100) to extending completely through the substrate.

At 204, one or more fins 102, 104 are formed on the substrate 106. For example, each fin 102, 104 is formed by etching the surface of the substrate 106 to create a fin of the substrate material. As an example, an epitaxial layer (e.g., monocrystalline silicon) is grown on the substrate surface after the buried doped layer 108 is formed and the epitaxial layer is etched to form the fins 102, 104. Alternatively, fins 102, 104 may be formed by etching the substrate 106 to create a fin of the substrate material.

Figure 5:
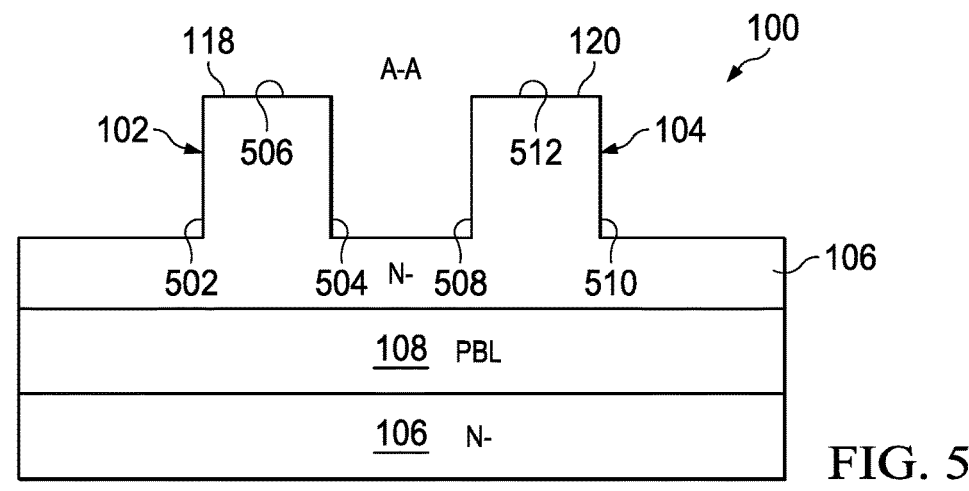
FIGS. 5 and 6 are cross-sectional views showing fins being formed on a substrate for an example fin transistor.
Figure 6:
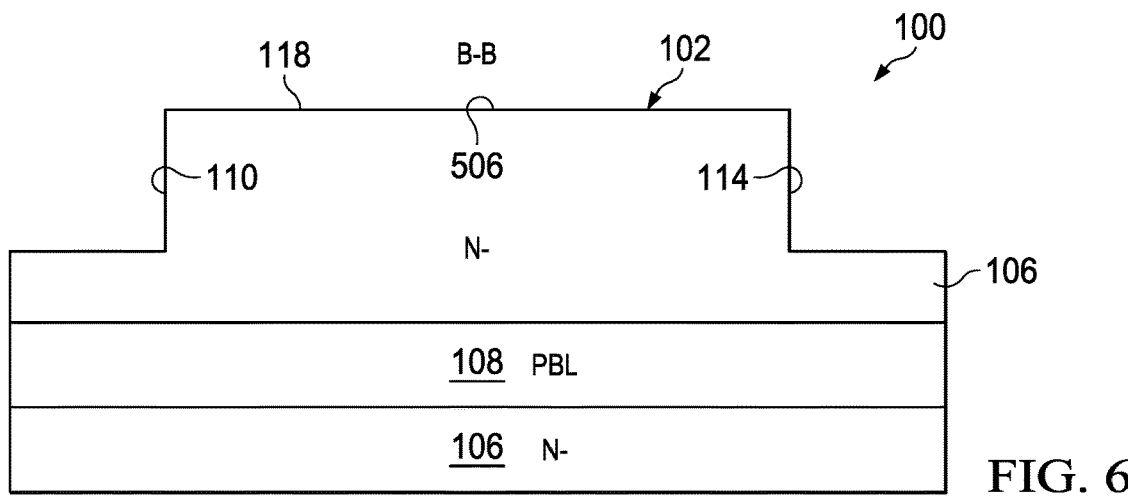

FIGS. 5 and 6 show an example of the fins 102 and 104 being formed on the substrate 106 taken in a direction along lines A-A and B-B of FIG. 1, respectively. In the example of FIGS. 5 and 6, fin 102 includes lateral sidewalls 502 and 504 and a top sidewall 506. Similarly, fin 104 includes lateral sidewalls 508 and 510 and a top sidewall 512. Also, each of the fins 102, 104 has a cross-sectional shape, which in this example is rectangular. As shown in FIG. 6, with respect to fin 102, the fin extends from the first end 110 longitudinally and terminates at the second end 114 spaced apart from the first end. In the examples of FIGS. 3-26, the buried doped layer 108 is shown to extend completely through the substrate 106, and fins 102, 104 are similarly configured with uniform cross sections along their length.

In other examples, different cross-sectional shapes, relative sizes and geometries may be utilized to form a fin transistor. For example, serpentine or circular shaped fin geometries may be used. Additionally, while each of the fins 102, 104 is shown as having the same geometry and size, fins of different sizes and shapes may be formed on the same substrate 106 in other examples. Each fin 102, 104 may extend a height above the surface of the substrate and have a width between respective sidewalls 118, 120 of the fin. In some examples, end portions of the fins 102, 104 may be wider than the intermediate portion for source/drain landing pads. The geometry of each fin 102, 104 and spacing between adjacent sidewalls 504 and 508 of respective fins may be configurable process parameters.

Figure 7:
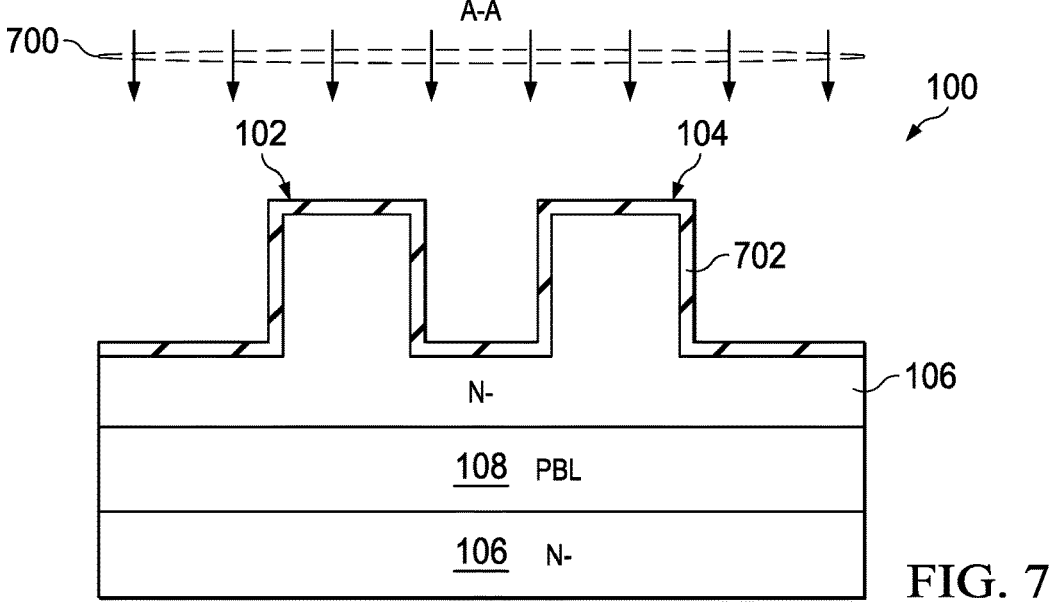
FIGS. 7 and 8 are cross-sectional views depicting a pad oxide dielectric layer being formed on the substrate including sidewalls of an example fin transistor.
Figures 8, 9:
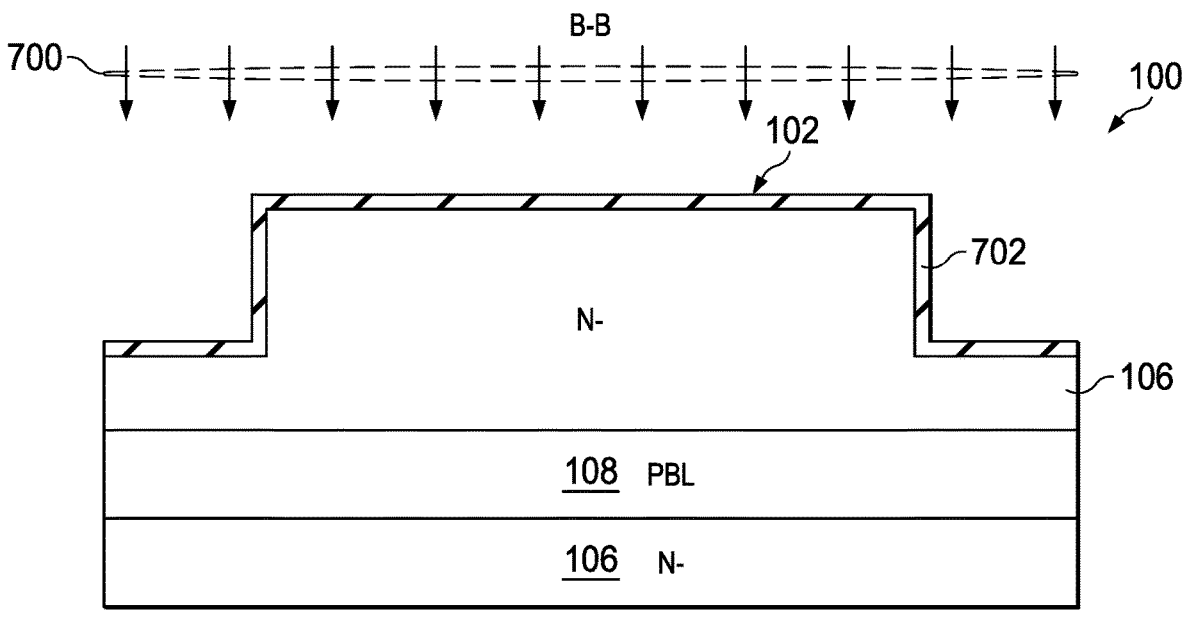
FIGS. 9, 10 and 11 are cross-sectional views showing formation of a doped control layer for an example fin transistor.

At 206, a dielectric layer is formed over the substrate and fins 102, 104. As shown in FIGS. 7 and 8 (taken in a direction along lines A-A and B-B of FIG. 1, respectively), the dielectric layer 702 may be formed by growing or depositing dielectric material by a process 700 over the entire exposed surface including the sidewalls 118, 120 of the fins 102, 104 and surface of the substrate 106. In an example, the dielectric layer 702 includes one or more layers (e.g., a stack) of oxide and nitride layers over all exposed surfaces of the substrate 106 and fins 102, 104. The oxide layer(s) may be silicon dioxide thermally grown or deposited, and the nitride layer(s) may be silicon nitride applied by chemical vapor deposition. In some other examples, a high-k material such as hafnium oxide or hafnium silicate may be employed.

At 207, channel, field and drift regions are formed in the structure by implanting respective dopant into the fins 102, 104 and substrate 106. For example, the structure is patterned with photoresist and a given dopant is implanted into through the dielectric layer 702 to form the respective channel region, which resides a location between where gate and source regions are to be formed. Other masking may be used to form each of the field and drift regions of the respective fin transistor(s) on the IC 100. For example, drift region is formed along the fins between the respective channel and drain regions. Respective dopants may be applied by ion implantation, such as pulsed-plasma doping or other conformal doping methods. The dopant species used to form each of the channel, field and drift regions will depend on the type of fin transistor. For example, the dopant species for the field and drift regions may be an N-type dopant (e.g., phosphorous, antimony, arsenic or other n-type dopant species) when forming an N-type fin transistor, or a P-type dopant (e.g., boron, indium or other p-type dopant species) when forming a P-type fin transistor. The dopant species for the channel region may be a p-type dopant for an N-type fin transistor, and an N-type dopant for a P-type fin transistor.

Figure 10:
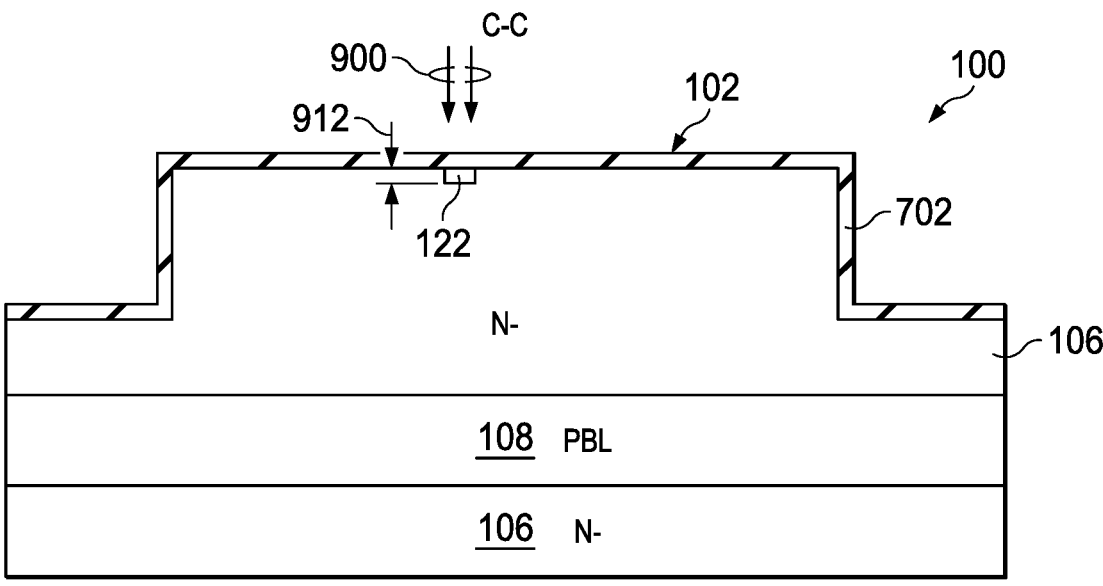
Figure 11:
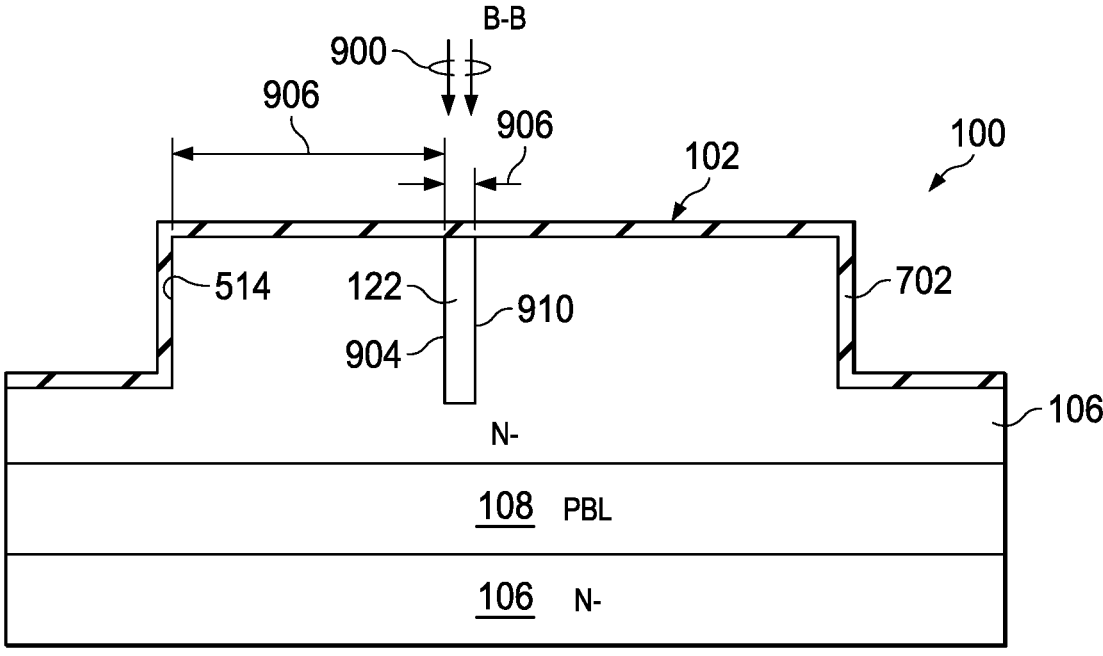

At 208, a doped control layer 122, 124 is formed along respective fins 102, 104. In the examples of FIGS. 9, 10 and 11, a control layer dopant 900 is implanted to form a single doped control region 902 along sidewalls of fins 102, 104, overlying a drift region, to form doped control layers 122, 124 for respective fins 102, 104. For example, FIG. 9 is taken along line A-A of FIG. 1, FIG. 10 is taken along the line C-C of FIG. 1 (near the center of the fin 102), and FIG. 11 is taken through the fin 102 along line B-B of FIG. 1 (through an edge of the fin 102). As an example, the IC 100 is patterned and etched to expose a surface area where the control layer dopant 900 is implanted at 208. Thus, the control layer dopant 900 is implanted (at 208) through the dielectric layer 702 to form the doped control region 902 along areas of the fins and substrate the exposed by patterned resist. For example, the doped control region 902 extends into the respective each fin 102, 104 and the substrate a depth 912, as shown in FIG. 10. The doped control region 902 thus provides a shallow doped region along the respective fins 102, 104 surrounding a portion of the drift region.

The control layer dopant 900 may be implanted (at 208) by plasma doping, ion implantation or other conformal doping methods. The dose and energy levels used for implanting control layer dopant 900 along the sidewall of the fin at 208 may vary depending on the dopant species that is used. As an example, control layer dopant 900 may be implanted with a dose in the range from about 1E14 ions/cm$^2$ to about 5E15 ions/cm$^2$ at an energy level in a range from about 1 keV to about 15 keV. The energy levels for implanting dopants to form the drift region (at 207) would be much higher, such as in the range from about 20 keV to about 100 keV for injecting dopants deeper into the fin structure to form respective drift regions between the channel and drain region. Additionally, the dose used for forming the drift layer (at 207) would be lower than for forming the doped control region 902 (e.g., in the range from about 1E12 ions/cm$^2$ to about 1E13 ions/cm$^2$). As described above, the use of one or more doped control layers 122, 124 and/or 108 thus enables use of higher net doping in the drift region (compared to existing transistors), which reduces the turn-on resistance of the drift region during conduction.

As shown in FIG. 11 with respect to the fin 102, the doped control layer 122, has a front edge 904 that is spaced from a front edge 514 of the fin 102 by a distance 906. The doped control layer 122 also has a width 908 that extends from the front edge 904 of the doped control layer to a second edge 910 thereof. The doped control layer 124 formed along the fin 104 may be similarly configured. The mask used for implanting the control layer dopant 900 can be configured to define the placement, width 908 and number of doped control layers applied to the fins 102, 104.

Figures 12, 13:
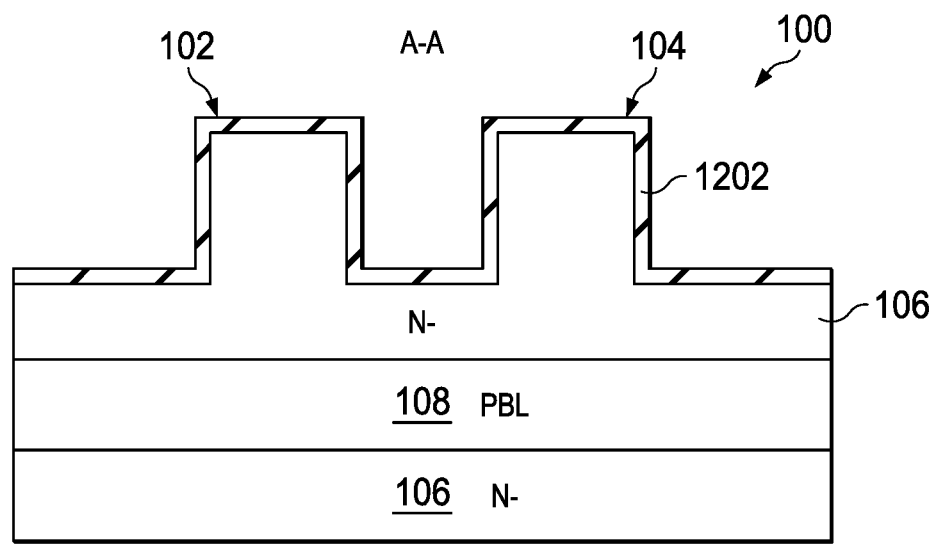
FIGS. 12 and 13 are cross-sectional views showing formation of an oxide layer for an example fin transistor.

While not shown in the method 200 of FIG. 2, in some examples, after implantation of the dopant 900, the structure may be in annealed to diffuse the dopant into the respective fins. After the dielectric has been stripped, field oxidation or thermal gate oxidation may be implemented to cover all exposed surfaces with oxide to form gate oxide layer 1202 over the exposed surfaces, as shown in FIG. 12 (taken in the direction along line A-A of FIG. 1). The field or high voltage gate oxide may be stripped from the exposed regions leaving the oxide on selected regions that may be covered by resist pattern. The resist may be stripped and then a thin gate dielectric layer may be formed over the entire structure. Regions where there was already oxide present, as described above, will grow slightly thicker and regions where there was no oxide will have the thin gate dielectric only. For example, as shown in FIG. 13 (taken in the direction along line B-B of FIG. 1), a thicker field or high-voltage (HV) oxide layer 1204 (e.g., ranging from about 10 nm to about 200 nm) may be formed along the top sidewall portion of the respective fins 102, 104, and a thinner gate oxide layer 1202 (e.g., ranging from about 1 nm to about 10 nm) is formed on the remaining surfaces of the structure, including other fin surfaces and the substrate surface. A junction between the thinner gate oxide layer 1202 and the thicker oxide layer 1204 forms steps 1206 and 1208, shown in FIG. 13.

Figure 14:
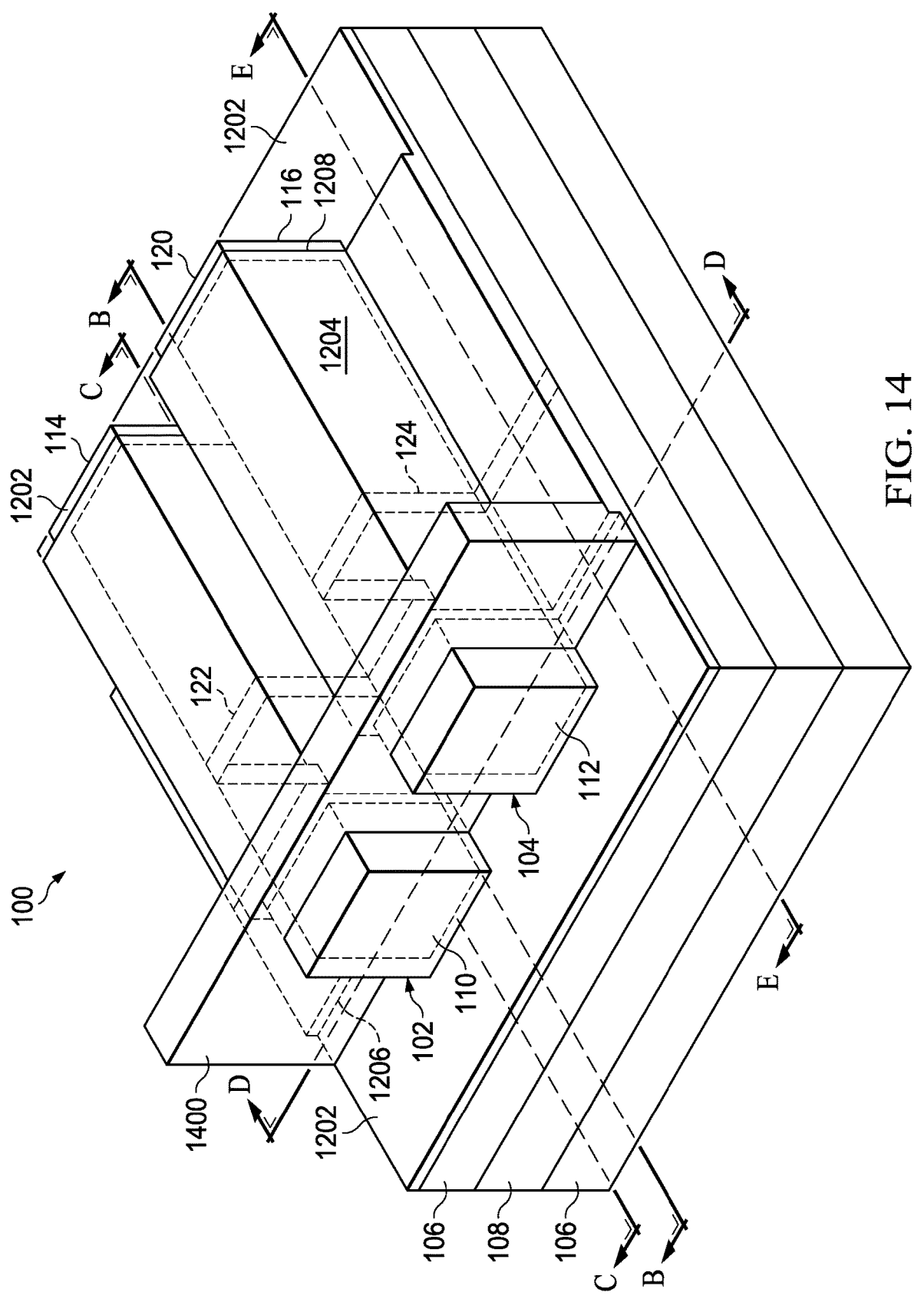
FIG. 14 is an isometric view of a gate structure being formed for an example fin transistor.
Figure 15:
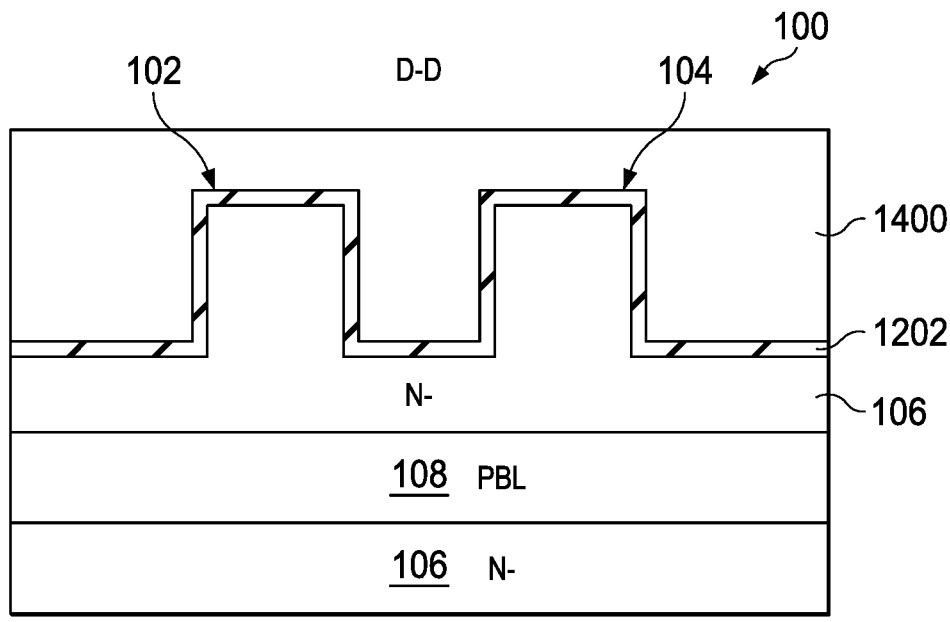
FIGS. 15 and 16 are cross-sectional views of the structure of FIG. 14.
Figure 16:
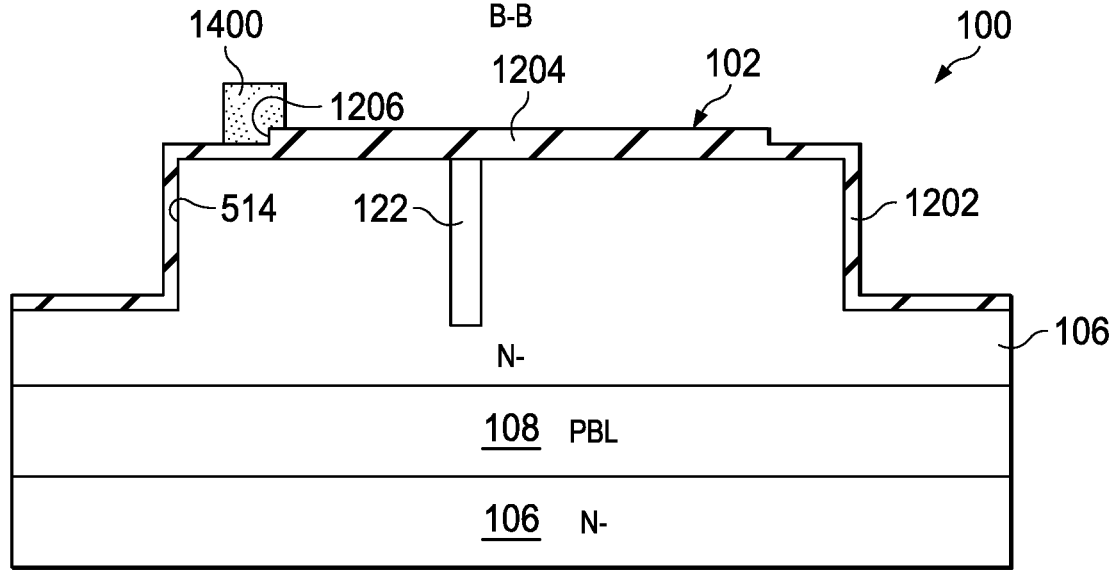

At 210, a gate structure is formed. For example, as shown in FIGS. 14, 15 and 16, a gate structure 1400 is formed on the respective fins 102, 104 (where FIG. 15 is taken along line D-D of FIG. 14, and FIG. 16 is taken along line B-B of FIG. 14 through an edge of fin 102). For example, the gate structure 1400 is formed over a front portion of respective fins 102, 104 adjacent ends 110, 112, such as formed over the respective step 1206 of the gate oxide layer (shown in FIG. 13) where the thickness of the oxide layers 1204 and 1202 changes.

In an example, the gate structure 1400 may be formed (at 210) by depositing polysilicon over the fin 102, 104 and exposed surface. The polysilicon may be in-situ doped or ex-situ doped. The gate material may be processed such as through chemical mechanical polishing (CMP) methods. The gate may be patterned using photoresist, and the gate resist is patterned and developed. The exposed polysilicon may then be etched using plasma etching (e.g., anisotropic/directional etching) to form the gate structure 1400 shown in FIGS. 14-16. In some other examples, the gate structure 1400 may be metallic, e.g. a "metal gate" analogous to metal gates used in some planar devices.

Figure 17:
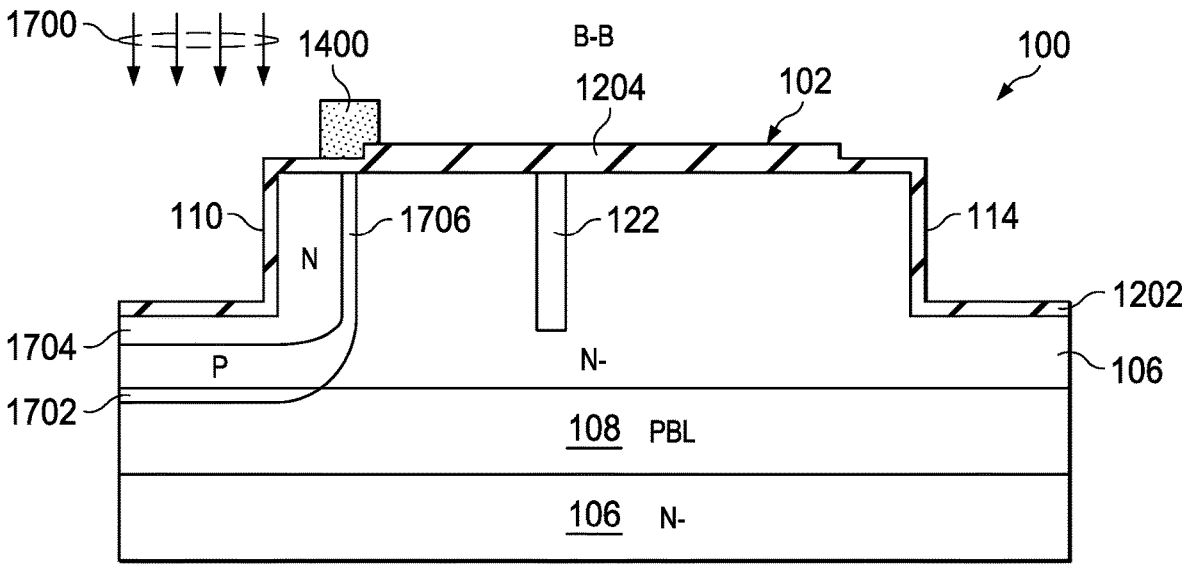
FIGS. 17 and 18 are cross-sectional views showing formation of a source region for an example fin transistor.
Figure 18:
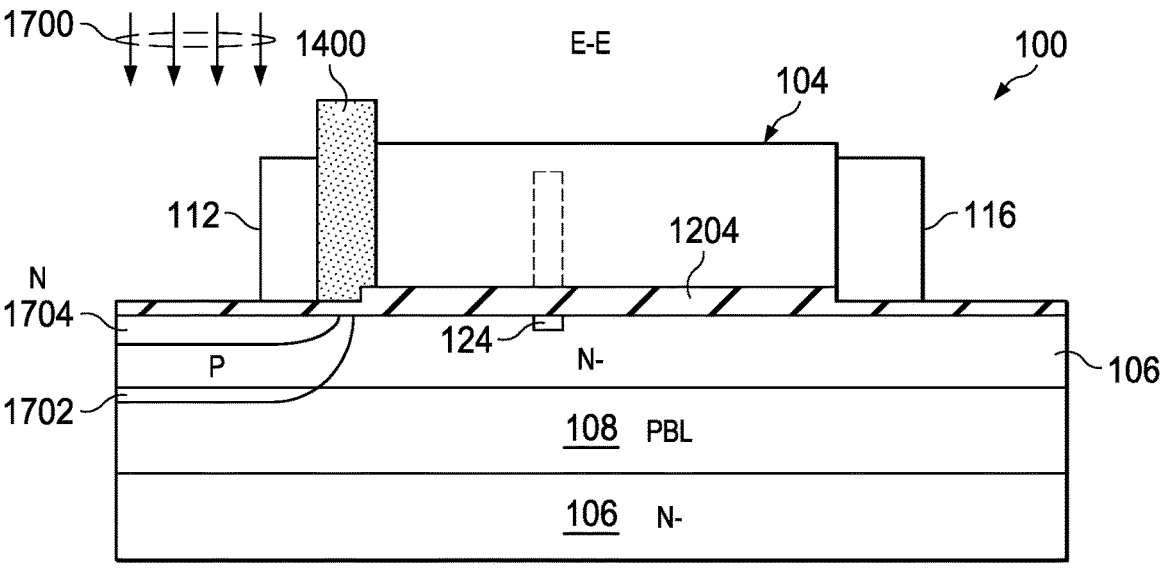

At 212, a body region 1702 and a source region 1704 are formed. For example, as shown in FIGS. 17 and 18 (where FIG. 17 is taken in the direction of line B-B of FIG. 14 and FIG. 18 is taken in the direction of line E-E of FIG. 14), the body region 1702 is formed by implanting body dopants 1700 through patterned photoresist into exposed substrate 106 and fins 102, 104 adjacent ends 110, 112. For example, as shown in FIGS. 17 and 18, body and source dopants 1700 are implanted (at 212) into the region near the gate structure 1400. For the example of an N-type fin transistor, a deep P-type dopant may be implanted to form a deep the body region 1702 and another shallower N-type dopant implanted to form a shallower source region 1704. In an example, the deep implants may extend into the buried doped layer 108, as shown in FIGS. 17-18. For the example of a P-type fin transistor, a deep N-type dopant would be implanted to form an N-type body region 1702 and with shallower P-type implants to form a P-type source region 1704. After implantation the resist may be stripped from the wafer and a thermal anneal performed to promote diffusion of the implanted species to into the fins 102, 104 and under the gate structure 1400. Thus, the region in the respective fins 102, 104 a channel region 1706 is formed under the gate structure 1400.

Figure 19:
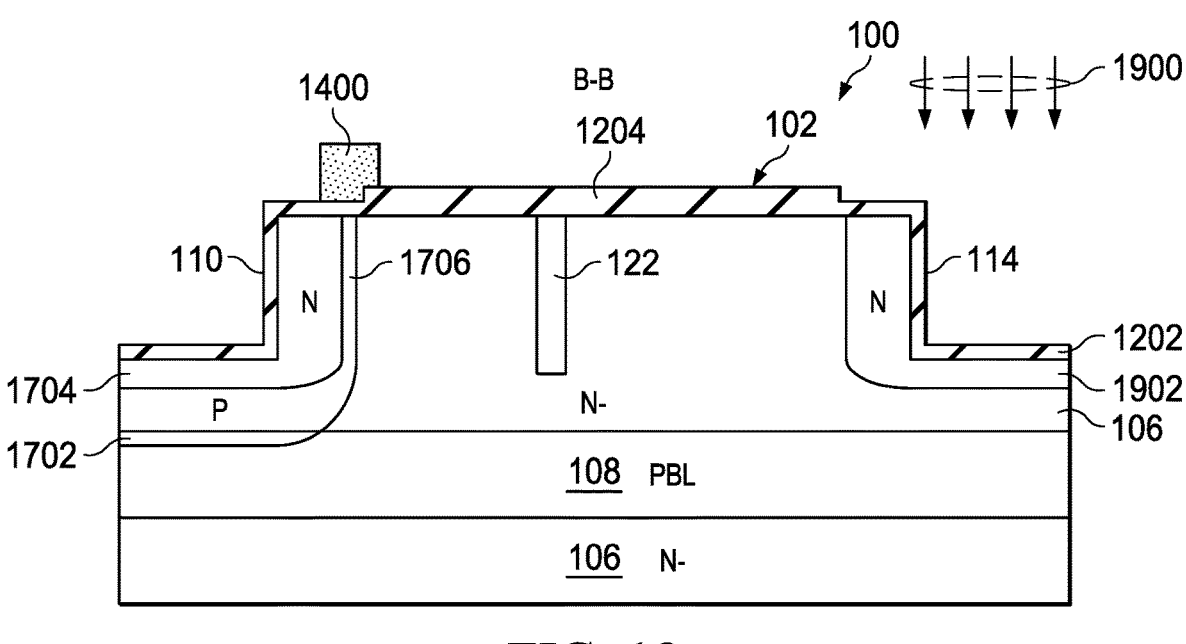
FIGS. 19 and 20 are cross-sectional views showing formation of a drain region for an example fin transistor.
Figure 20:
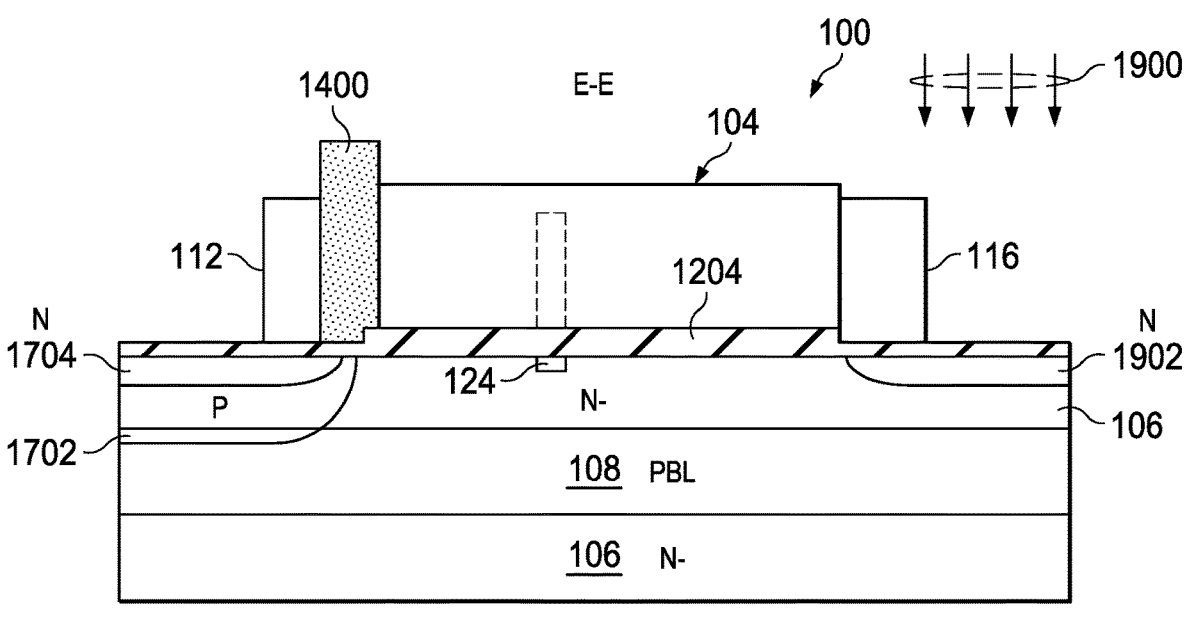

At 214, a drain region 1902 is formed. For example, as shown in cross-sectional views of FIGS. 19 and 20 (where FIG. 19 is taken in the direction of line B-B of FIG. 14 and FIG. 20 is taken in the direction of line E-E of FIG. 14), the drain region 1902 may be formed by implanting a drain dopant 1900 through patterned photoresist into exposed substrate 106 and fins 102, 104. For example, the drain formation (at 214) may include coating a structure with resist and patterning the resist to expose an area adjacent ends 114, 116 of respective fins 102, 104 where the drain region 1902 is to be formed. For the example of an N-type fin transistor, an N-type dopant may be implanted 1900 to form the drain region 1902. For the example of a P-type fin transistor, a P-type dopant may be implanted 1900 to form the drain region 1902. After implantation, the resist may be stripped and thermal anneal performed to diffuse the drain implant into the substrate 106 and laterally into the fins 102, 104 to complete forming the drain region 1902.

Figure 21:
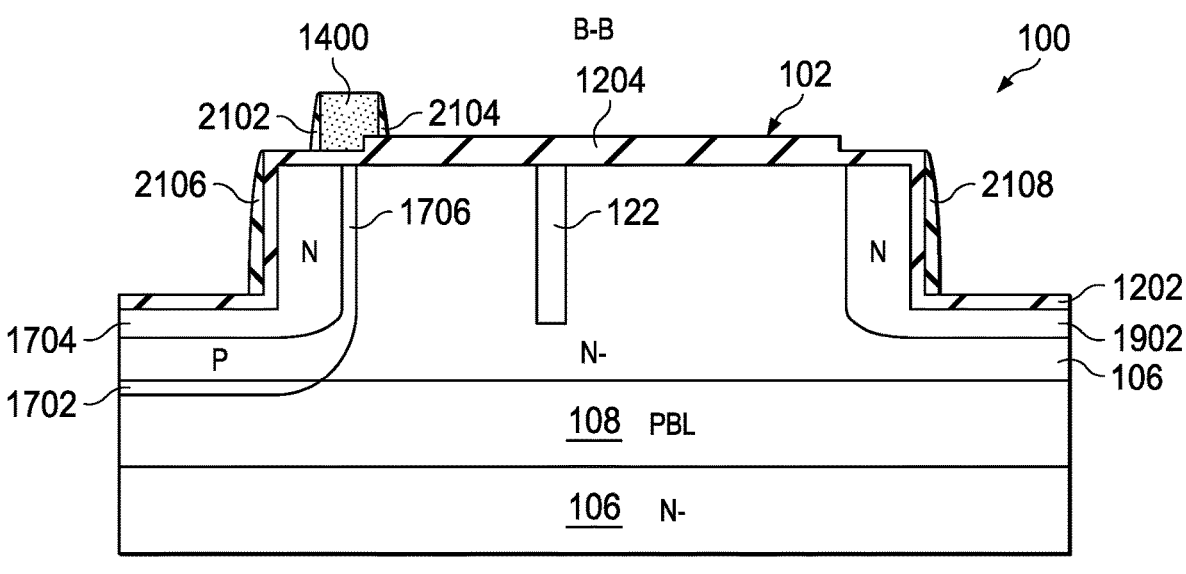
FIGS. 21 and 22 are cross-sectional views showing spacer formation for an example fin transistor.
Figure 22:
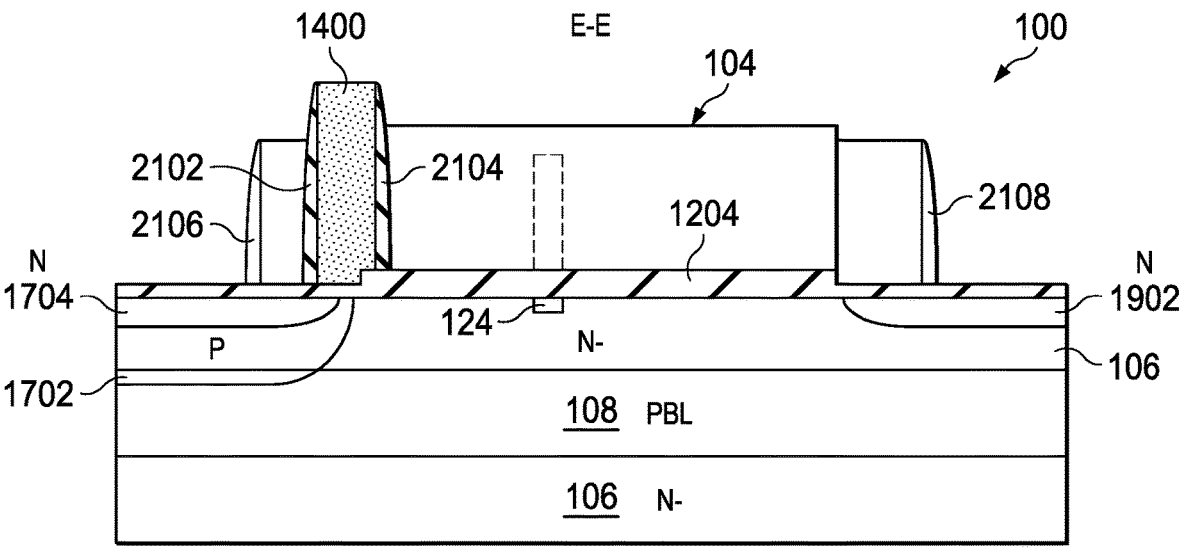
Figures 23, 24:
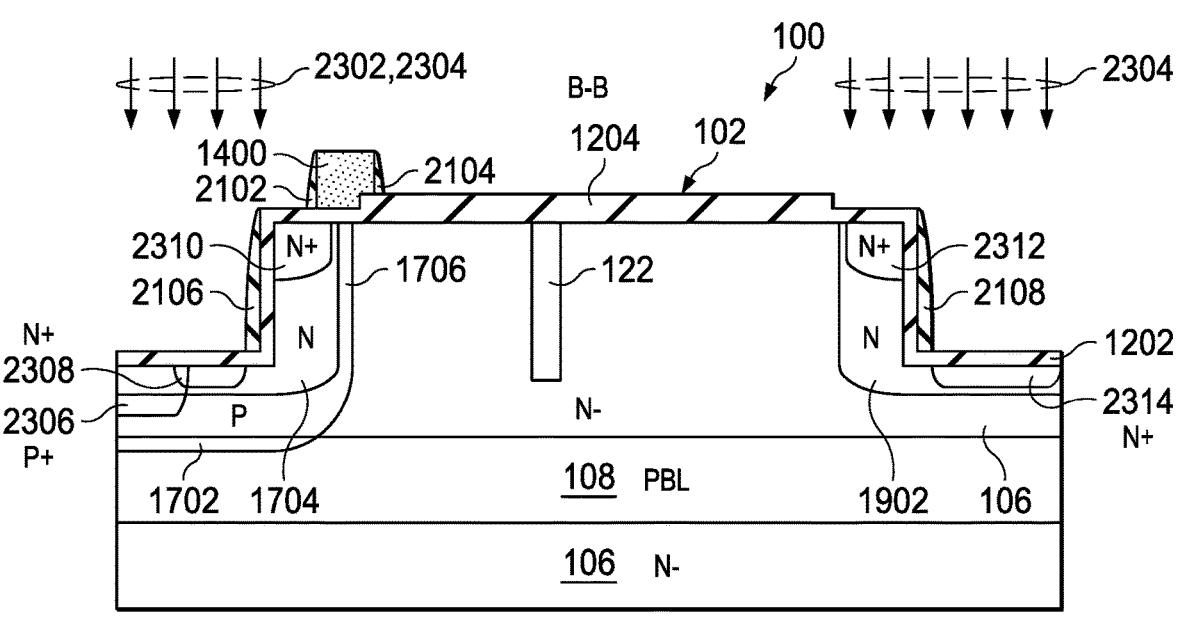
FIGS. 23 and 24 are cross-sectional views showing source drain implants for an example fin transistor.

At 216, sidewall spacers are formed over the fins 102, 104 and gate structure 1400. For example, as shown in FIGS. 21 and 22 (respectively taken along lines B-B and E-E of FIG. 14) sidewall spacers may be formed along the sidewalls extending orthogonal to the surface of the substrate 106. For example, sidewall spacers 2102 and 2104 may be formed along the sidewalls of the gate structure 1400. Sidewall spacers 2106 and 2108 may be formed along respective front and rear sidewalls of the respective fins 102, 104. Not explicitly shown, sidewall spacers may also similarly be formed along lateral sidewalls 502, 504 of the fin 102 and lateral sidewalls 508 and 510 of the fin 104.

At 218, a series of implantations are performed at the source and drain regions. For example, as shown in the cross-sectional views of FIGS. 23 and 24 (respectively taken along the lines of B-B and E-E of FIG. 14), dopants 2302 are implanted to form body tap 2306. Additionally, dopants 2304 are implanted to form source taps 2308 and 2310 and drain taps 2312 and 2314. During fabrication each of the respective regions 2306, 2308, 2310, 2312 and 2314 may be formed through a series implantation steps with patterning to expose areas where respective dopants are to be implanted at respective energy levels. For example, dopants 2304 are implanted (e.g., having a first conductivity type at a respective dose and energy level) through respective patterned photoresist to form respective source taps 2308, 2310 and drain taps 2312, 2314. The dopants 2304 are implanted to form regions source taps 2308, 2310 and drain taps 2312, 2314 with high doping in the source region 1704 and the drain region and 1902. Similarly, the body tap 2306 is formed to provide a vertical connection to the body region 1702. In an example, to form an N-type fin transistor, the body tap 2306 is implanted using a P-type dopant and the source taps 2308, 2310 are implanted using N-type dopants. Alternatively, for a P-type fin transistor, the body tap 2306 includes N-type dopants and source taps 2308 and 2310 include P-type dopants.

Similarly, at 218, the drain dopants 2304 are implanted (e.g., at respective doses and energy levels) through a sequence of drain-patterned photoresists to form the respective drain taps 2312 and 2314 in the substrate of the drain region 1902. In an example, to form an N-type fin transistor, the drain taps 2312 and 2314 are implanted using N-type dopants, which may be performed concurrently with implanting source dopants to form source taps 2308 and 2310. Alternatively, for a P-type fin transistor, the drain taps 2312 and 2314 include P-type dopants. The drain taps 2312 and 2314 may be formed in process steps concurrently with forming source taps 2308 and 2310. After forming source/ drain regions, at 218, remaining photoresist may be stripped and the structure annealed to promote diffusion of implanted dopants.

Figure 25:
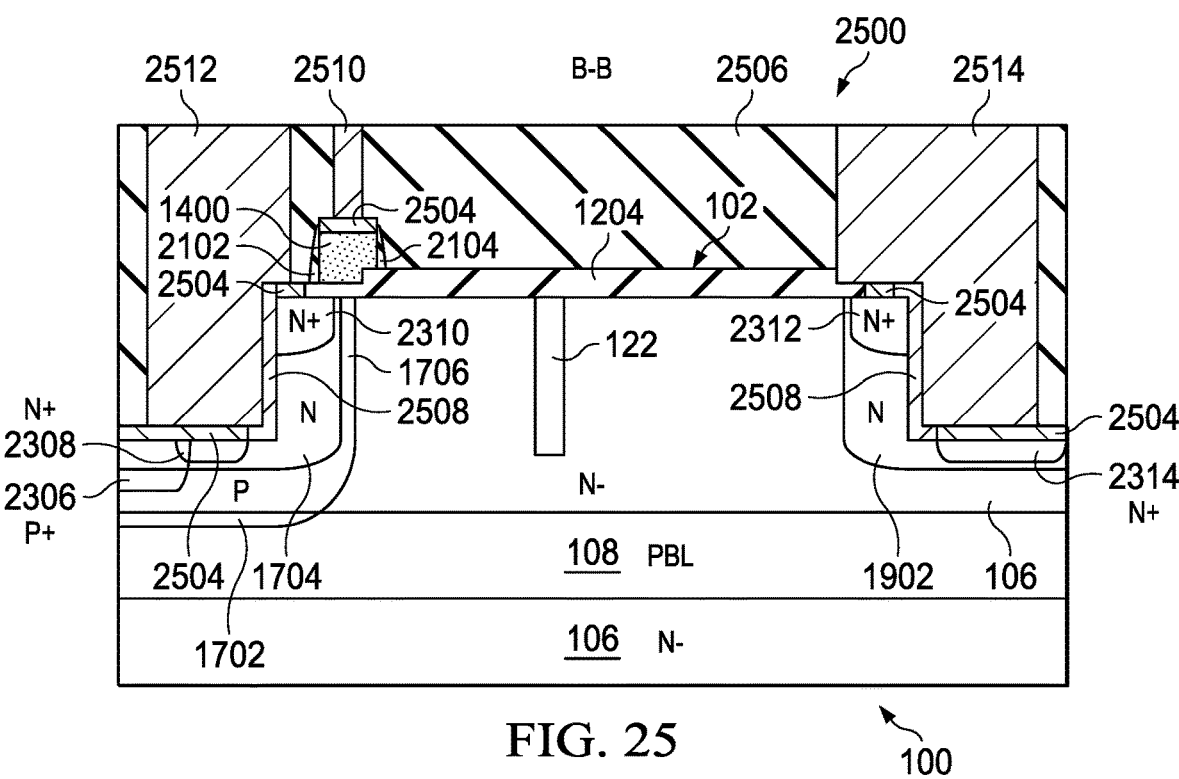
FIGS. 25 and 26 are cross-sectional views showing an example of a completed fin transistor.
Figure 26:
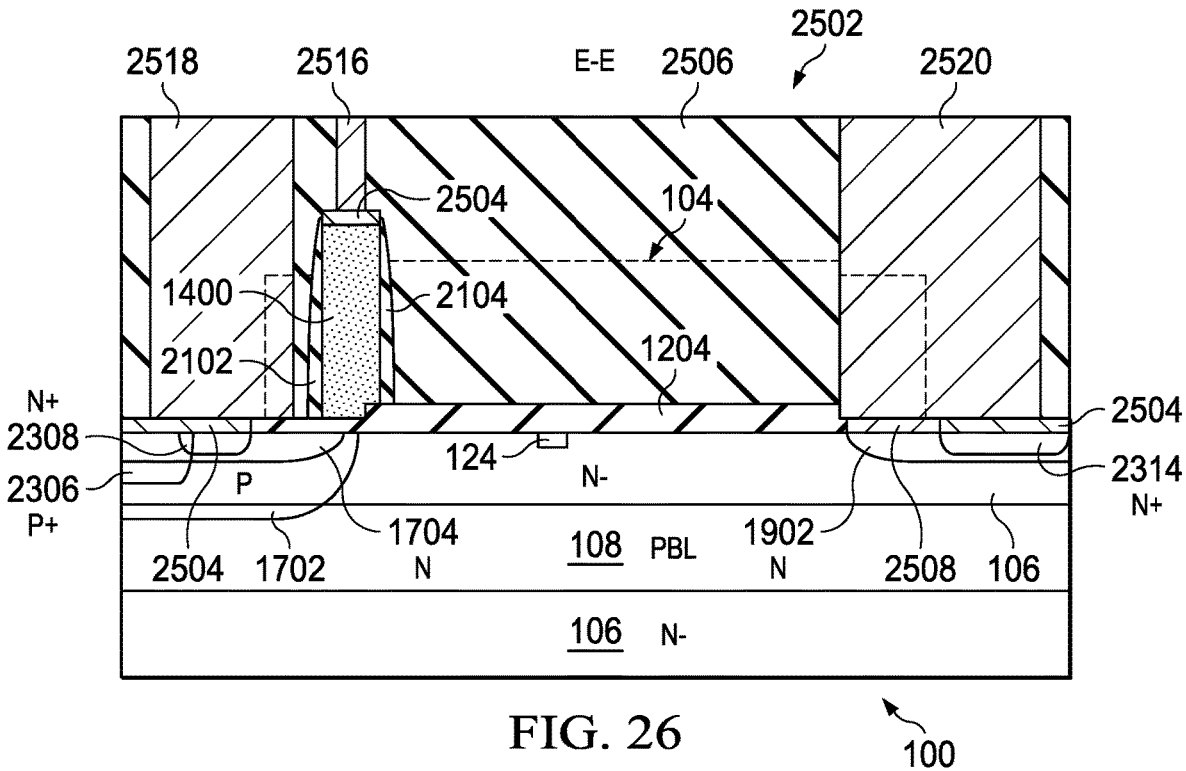

At 220, back end of line (BEOL) processing is performed to provide respective interconnects for the IC 100, including one or more fin transistors. FIGS. 25 and 26 are cross-sectional views (taken in the direction along lines B-B and E-E, respectively, of FIG. 14) showing an example of the completed fin transistors 2500, 2502 for respective fins 102, 104 following BEOL processing. In an example, the BEOL may include removing spacers from ends of the fin, silicide formation on exposed surfaces, adding contact slots, metal terminals and/or routing contact traces to the respective fin transistors 2500, 2502.

As shown in FIG. 25, the fin transistor 2500 includes a silicide layer 2504 over a top surface the IC 100. For example, the silicide 2504 is formed by depositing metal (e.g., Ni, Co, or any other silicide metal) on the surface of IC 100 followed by silicide-formation thermal treatment, stripping of unreacted metal, and a silicide thermal anneal process. Contact formation may follow forming of the silicide layer 2504. For example, contact formation may include depositing a pre-metal dielectric (PMD) 2506 over the IC 100 followed by CMP, resist patterning and etching to form contact slot regions over gate structure 1400, source region 1704, 1702, drain region 1902 as well as any other regions where contacts are to be formed. A contact-barrier metal silicide 2508 may be formed (e.g., by depositing Ti or other metal) over exposed silicon surfaces followed by forming respective contacts of a contact plug material (e.g., by tungsten deposition followed by CMP). For example, metal contacts 2510, 2512 and 2514 are formed for the respective gate, source and drain regions of the fin transistor 2500, and contacts 2516, 2518 and 2520 are formed for the respective gate, source and drain regions of the fin transistor 2502. Optionally the illustrated metal contacts 2512 and 2518 may be a same metal contact that connects to the sources of both the fin transistor 2500 and the fin transistor 2502. Similarly the illustrated metal contacts 2514 and 2520 may be a same metal contact that connects to the drains of both the fin transistor 2500 and the fin transistor 2502. In such examples the fin transistors 2500 and 2502 may be regarded as portions of a same transistor having multiple fins. One or more additional contacts may be formed to couple to the doped control layers. For example, respective contacts may be coupled to doped control layers 122, 124 respectively at the tops of fins 102, 104 and/or a contact may be coupled to the buried doped layer through the substrate.

As described herein, fin transistors may be formed with doped control layers having various configurations to deplete fin regions during operation for improving the turn-on resistance and breakdown voltage relationship of the fin transistor. FIGS. 27 through 30 depict cross-sectional views showing some example embodiments of respective fins with doped control layers and that may be implemented in respective fin transistors (e.g., fin transistors 2500, 2502) formed according to methods described herein. The cross-sectional views of FIGS. 27-30 are taken through fins along a direction transverse to the longitudinal axis of fins to show the configuration of respective doped control layers.

Figure 27:
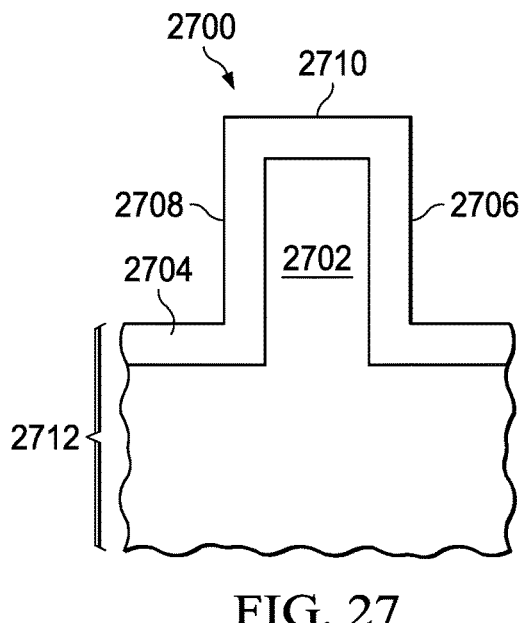
FIGS. 27, 28, 29 and 30 depict examples of different doped control layer configurations that may be used in a fin transistor.

In the example of FIG. 27, a fin transistor 2700 includes a fin 2702 having a doped control layer 2704 formed along each of the sidewalls 2706, 2708 and 2710 of the fin 2702, such as described herein. In the example of FIG. 27, the semiconductor substrate 2712, from which the fin 2702 extends, however, includes no buried doped layer (e.g., buried doped layer 108 is omitted from the fin transistor 2700). Thus in the example of FIG. 27, the doped control layer 2704 along the fin 2702 is used to control the field in the fin during fin transistor operation. Examples consistent with this configuration may reduce process complexity associated with forming the buried layer 108.

Figure 28:
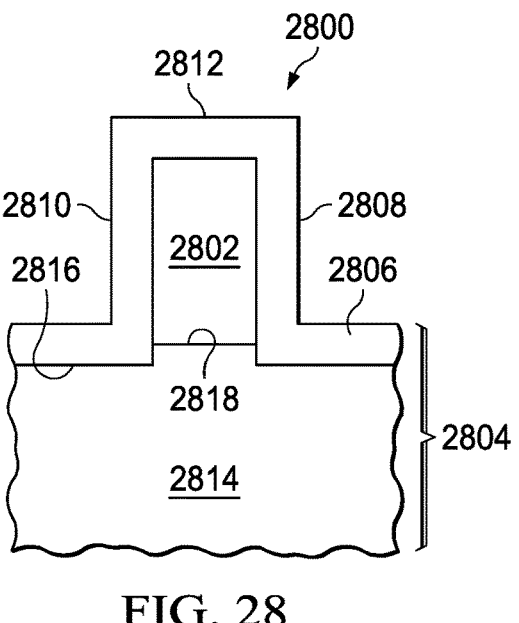

FIG. 28 depicts another example of a fin transistor 2800 that includes a fin 2802 extending from a substrate 2804. A doped control layer 2806 is formed along each of the sidewalls 2808, 2810 and 2812 of the fin 2802. A buried doped layer 2814 is also formed in the substrate 2804. In the example of FIG. 28, the doped control layer 2806 extends into the substrate to intersect (e.g., make contact with) the buried doped layer 2814 beneath the doped control layer. That is, a lower surface (e.g., lower edge) 2816 of the doped control layer 2806 extends into the substrate 2804 beyond a top planar surface 2818 of the buried doped layer 2814. This configuration provides control of the conductivity of the fin 2802 on four sides (e.g., along the fin periphery), in effect controlling conduction through a "tunnel" within the fin 2802.

Figure 29:
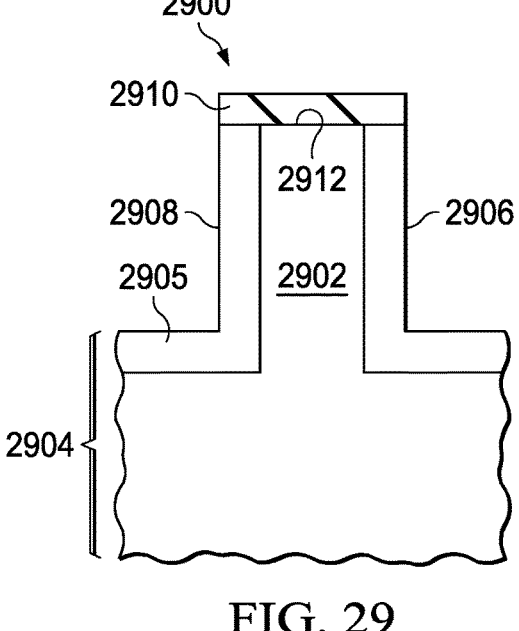

FIG. 29 depicts another example of a fin transistor 2900 that includes a fin 2902 extending outwardly from a semiconductor substrate 2904. In the example of FIG. 29, a doped control layer is formed along lateral opposing sidewalls 2906 and 2908 of the fin 2902. However, an implant blocking layer 2910 is formed along the top sidewall 2912 of the fin 2902 along the distal most end of the fin from the substrate 2904. For example, the implant blocking layer 2910 may be formed (e.g., grown or deposited) of a layer of nitride or oxide that is applied to prevent doping of the top surface 2912 of the fin 2902. A buried doped layer may be omitted from the fin transistor 2900, as shown, or the fin transistor may include a buried doped layer. This configuration may be suitable in designs that allow the drift layer to be effectively controlled using only two sides. In such cases, the top control layer may be omitted from the fin, thus providing greater cross-sectional area for current flow and reducing resistance without sacrificing potential control.

Figure 30:
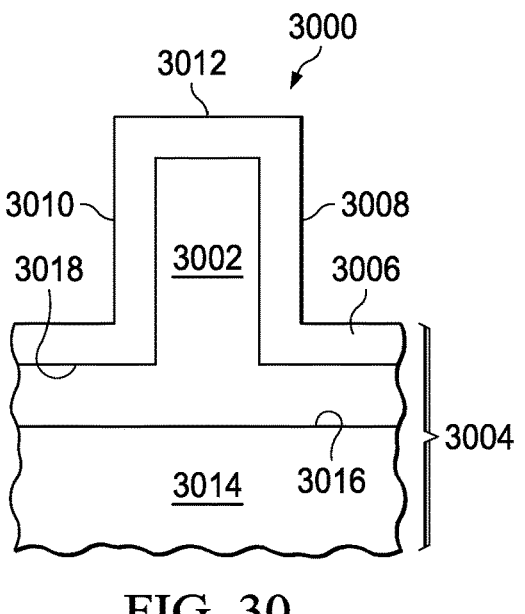

FIG. 30 depicts a cross-sectional view of another fin transistor 3000 that includes a fin 3002 extending from a semiconductor substrate 3004. In the example of FIG. 30, a doped control layer 3006 is formed along each of the sidewalls 3008, 3010 and 3012 of the fin 3002. In the example of FIG. 30, the fin transistor 3000 includes a buried doped layer 3014 having an adjacent top planar surface 3016 that is spaced apart from (e.g., not contacting) an adjacent surface (e.g., lower edge) 3018 of the doped control layer 3006 that is formed along the fin sidewalls and substrate surface. This configuration separates the buried layer 3014 from the control layer 3006 such that each may be independently controlled. For example, if the doped control layer 3006 is held at a same potential as the buried layer 3014, control of the fin resistance may be diminished somewhat, but the cross-sectional area of the fin conduction may be greater, resulting in lower resistance. If the control layer 3006 is biased separately from the doped layer 3014 (e.g., at different bias voltages), control of the fin conductivity may be improved while still retaining some improvement of fin conductivity.

FIGS. 31 through 36 depict cross-sectional views (taken in the direction along line B-B of FIG. 14) showing example fin transistors that may be formed with different configurations of doped control layers. Each of the fin transistors of FIGS. 31-36 may be formed by the method of FIG. 2 or as otherwise described herein. Thus, the reference numbers shown in FIGS. 31-36 refer to features of the transistor 2500 shown in FIG. 25.

Figure 31:
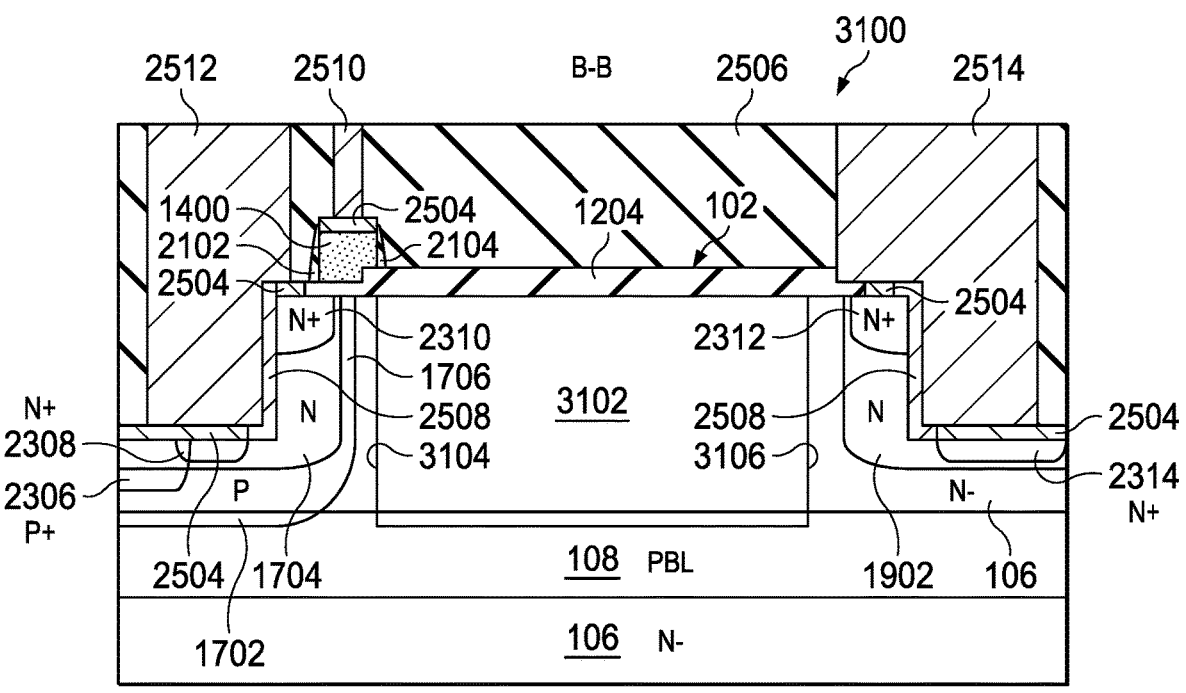
FIGS. 31, 32, 33 and 34 are cross-sectional views of a fin transistor in which a buried doped layer is below the fin.

FIG. 31 depicts an example fin transistor 3100 that includes the buried doped layer 108 that extends completely through the substrate 106 beneath the entire fin 102. A doped control layer 3102 is also formed on the fin 102. In the example of FIG. 31, the doped control layer 3102 is formed along each of the sidewalls of the fin 102 (e.g., wrapping along the sidewalls) over the drift region between the channel 1706 and the drain region 1902. Additionally, doped control layer 3102 extends into the substrate 106 and contacts the buried doped layer 108, similar to as shown in FIG. 28. As also shown in the example of FIG. 31, a first edge 3104 of the doped control layer 3102 is spaced apart from the channel 1706 beneath the gate structure 1400. A second edge of the doped control layer 3102 is adjacent the drain region 1902. Thus, in the example of FIG. 31, the doped control layer 3102 in combination with the buried doped layer 108 form a wrap that surrounds nearly the entire drift region between the channel and the drain regions. As described herein, each of the doped control layer 3102 and buried doped layer 108 has a first conductivity type and the drift region has a second opposite conductivity type.

Figure 32:
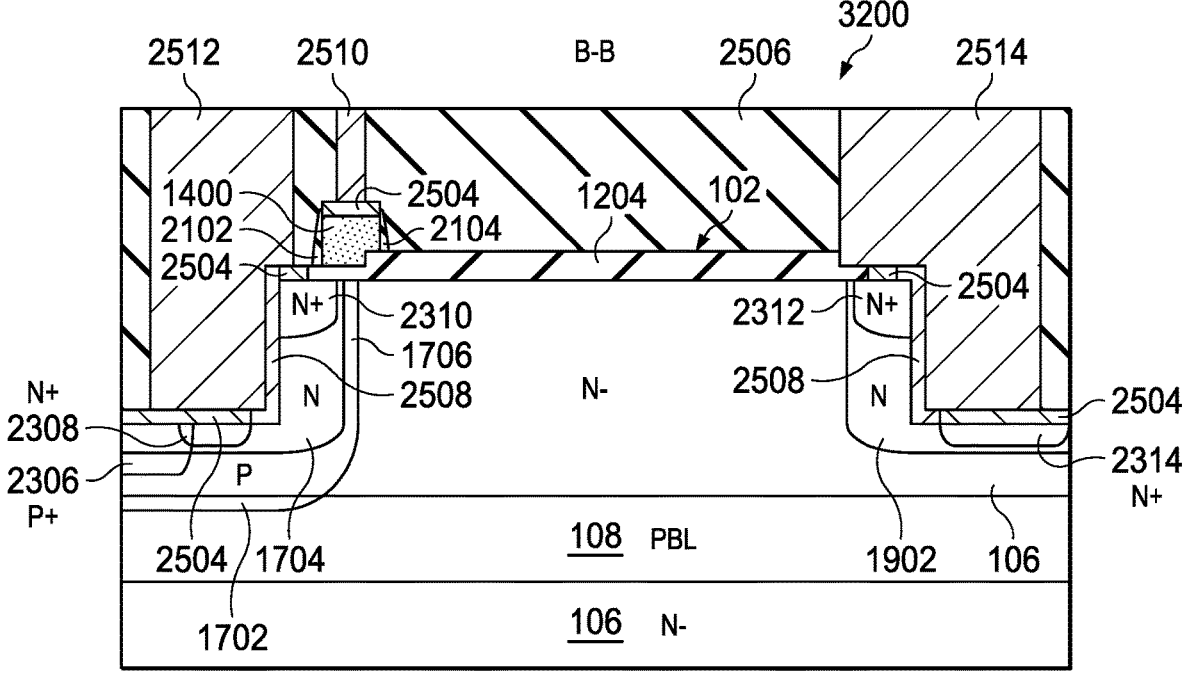

FIG. 32 depicts another example of a fin transistor 3200. In the example of FIG. 30, the fin transistor 3200 includes the buried doped layer 108 extending at least the entire length of the fin 102. However, the fin transistor 3200 does not include a doped control layer along the fin 102. That is, the doped control layer 3102 from the example of FIG. 31 (or doped control layer 122 from FIG. 25) has been omitted from the fin transistor 3200. Not explicitly shown, the buried doped layer 108 may be biased independently of the body region 1702. Thus, the buried doped layer 108 is configured to control the voltage potential of the drift region for the fin transistor 3200.

Figure 33:
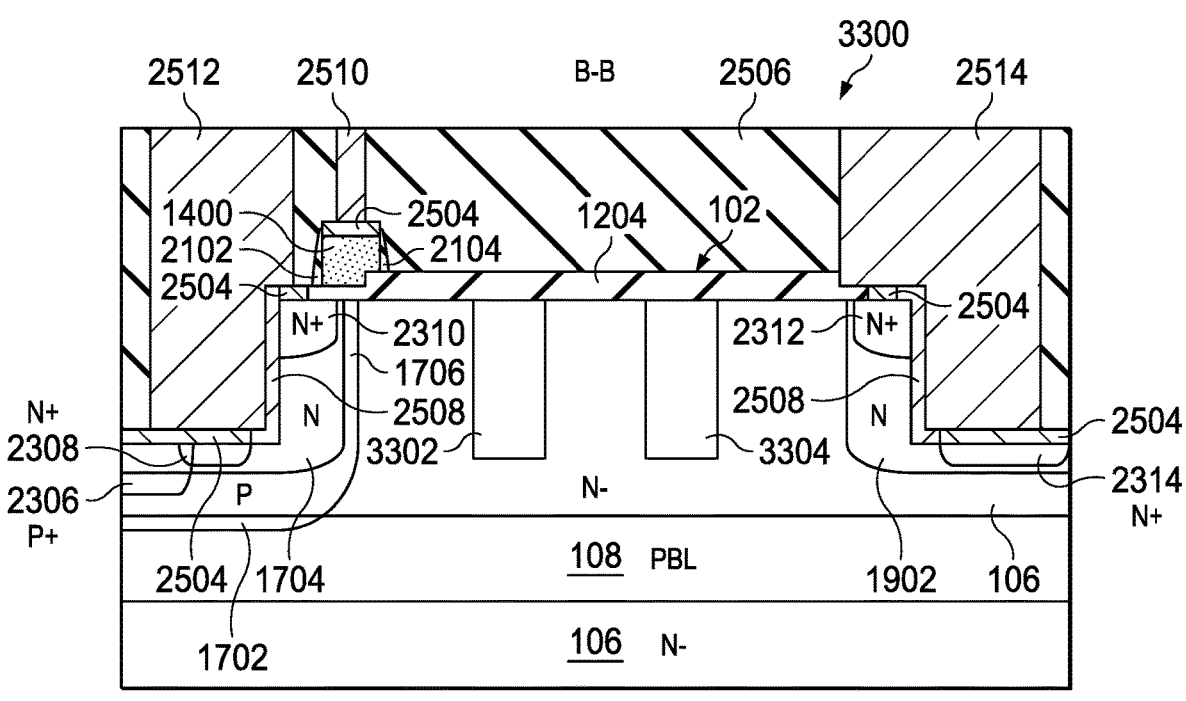

FIG. 33 depicts an example of another fin transistor 3300 that includes the buried doped layer 108 extending through the substrate 106 at least the entire length of the fin 102. In the example of FIG. 33, the doped control layer includes a plurality of doped control regions, shown at 3302 and 3304. The doped control regions 3302 and 3304 may extend along each of the sidewalls of the fin 102 around the drift region, as described herein. The doped control regions 3302 and 3304 can have respective widths extending in the longitudinal direction of the fin 102 (e.g., along line B-B of FIG. 1). The number of doped control regions and respective dimensions may be configured by use of a patterned photoresist mask during dopant implant (e.g., at 208 of the method 200 of FIG. 2). While two doped control regions 3302 and 3304 are shown in the example of FIG. 33, there can be any number of such regions distributed across the fin 102. Such design flexibility provides the ability to place any number of the doped control regions at any location as needed to control fin resistance in a desired manner.

Figure 34:
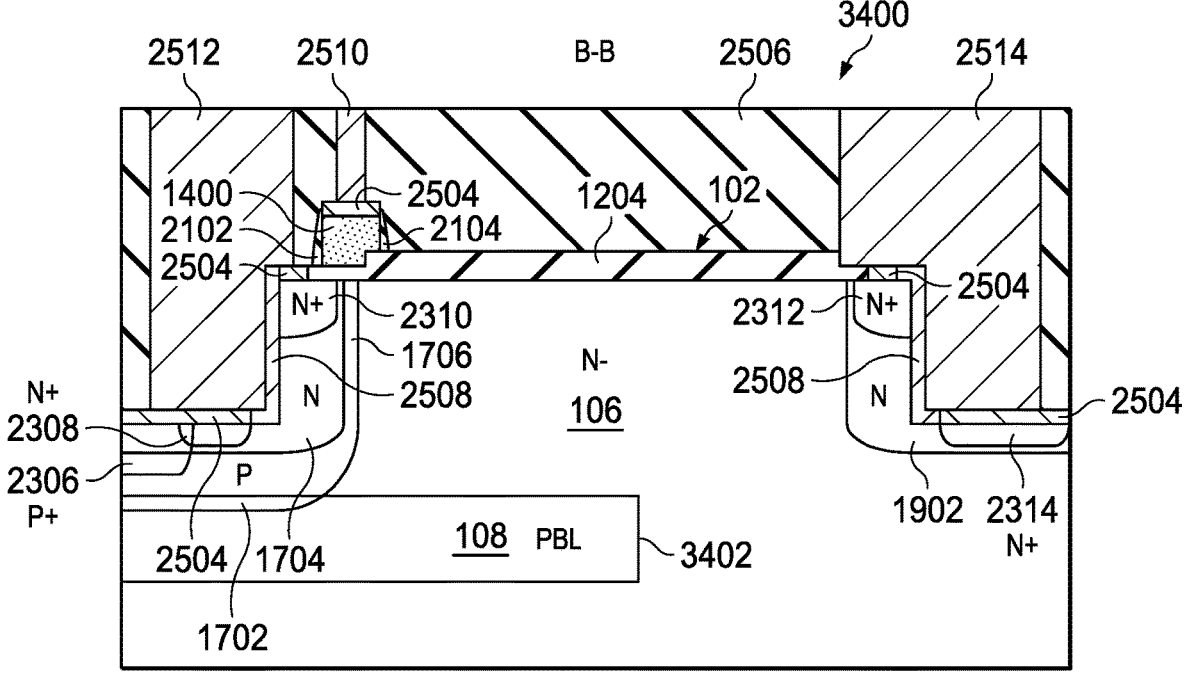

FIG. 34 depicts another example fin transistor 3200 in which no doped control layer has been formed along the sidewalls of the fin 102, similar to the example of FIG. 32. However, in the example of FIG. 34, the buried doped layer 108 extends only partly through the substrate beneath the fin 102 to terminate at an end 3402. For example, the end 3402 beneath the fin aligned with an intermediate location along the length of the fin 102.

Figure 35:
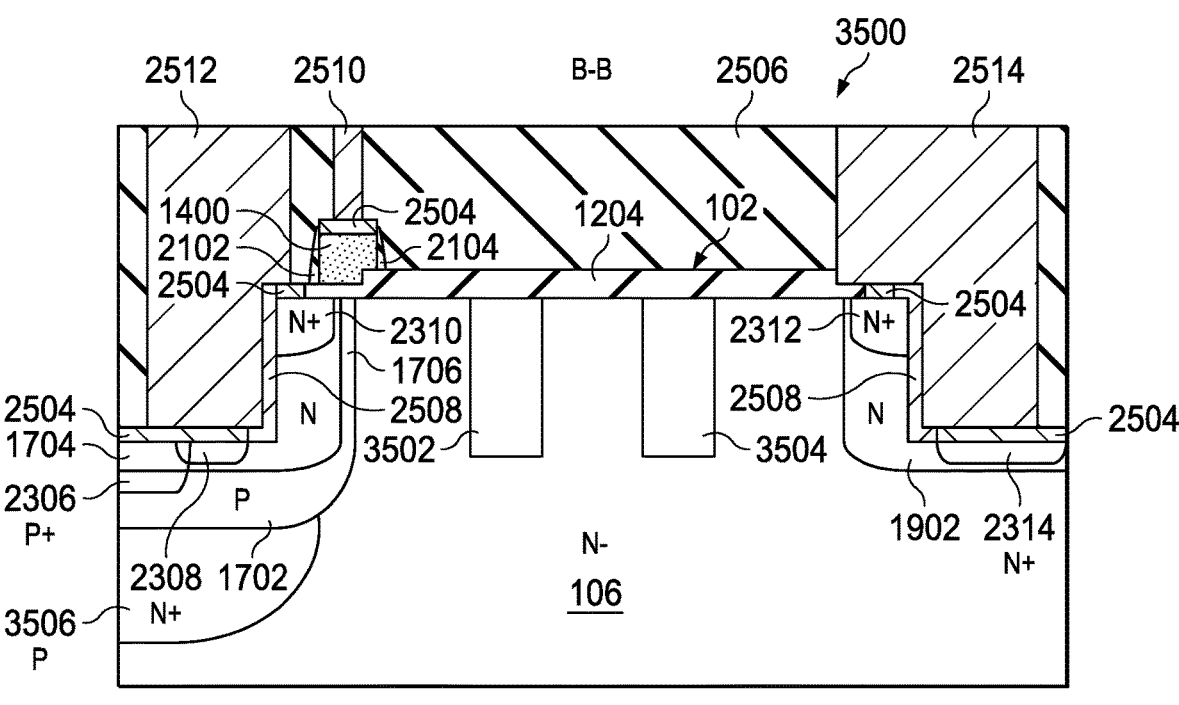
FIGS. 35 and 36 depict another example of a fin transistor having no buried doped layer beneath the fin.

FIG. 35 depicts another example fin transistor 3500 that includes a plurality of spaced-apart doped control regions 3502 and 3504 distributed along the length of the fin 102, such as described with respect to FIG. 31. In the example of FIG. 35, the fin transistor 3500 also includes a deep implant region 3506 formed in the substrate 106 beneath the gate structure 1400 and source region 1702. The deep implant region 3506 extends into the substrate beneath the source region 1702. The deep implant region 3506 is implanted with dopants having the same conductivity type as dopants implanted to form the body region 1702 and body tap 2306. For the example of an N-type fin transistor 3500, the deep implant region 3506 may be a P-type implant and the body region 1702 and body tap 2306 also include P-type dopants. The deep implant region 3506 may couple commonly doped regions body region 1702 and body tap 2306. The fin transistor 3500 does not include a buried doped layer (i.e., buried doped layer 108 is omitted from the transistor).

Figure 36:
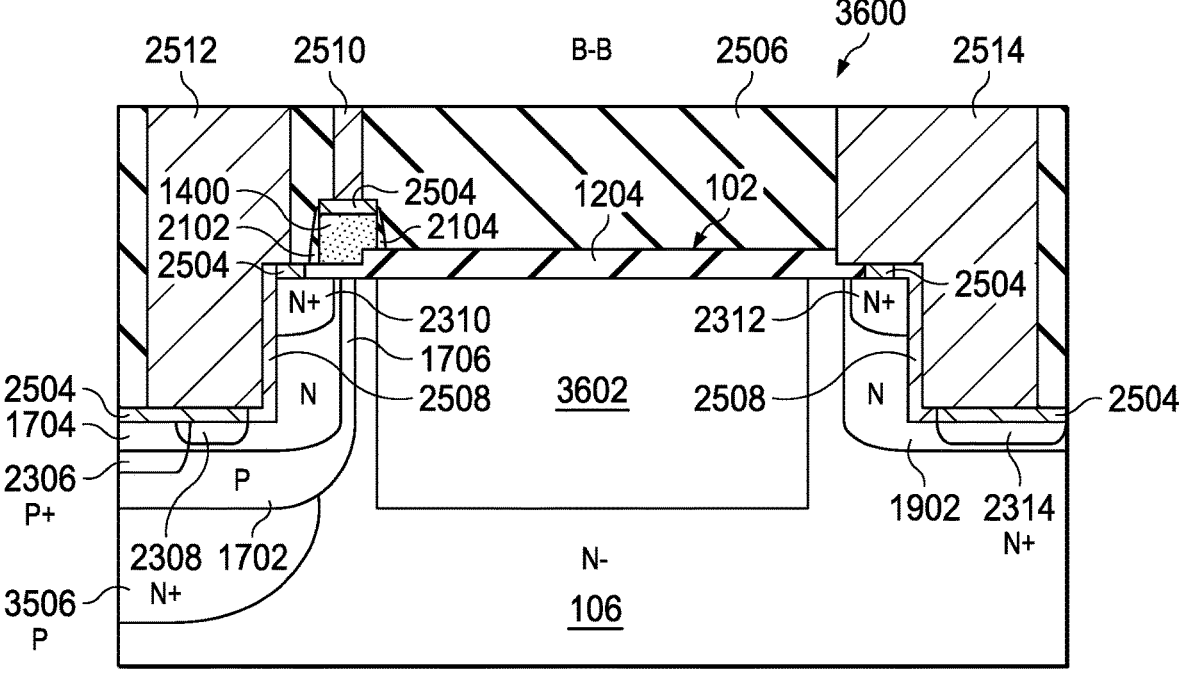

FIG. 36 depicts another example of a fin transistor 3600. As in the example of FIG. 35, the fin transistor 3400 includes deep implant region 3506 to interconnect the body region 1702 and body tap 2306. Additionally, the fin transistor 3400 includes a doped control layer 3602 that extends along each of the sidewalls of the fin 102 between the channel 1706 and drain region 1902, such as shown in the example of FIG. 31.

Each of the configurations of FIGS. 33, 34 and 35 have the effect of extending the effective body region, e.g. the body region 1702 plus the PBL 108, or the body region 1702 plus the deep implant region 3506. Such configurations may reduce the body resistance while also providing limited fin potential control. Constraints on the buried layer design may also be fewer and/or more relaxed with such configurations.

Figure 37:
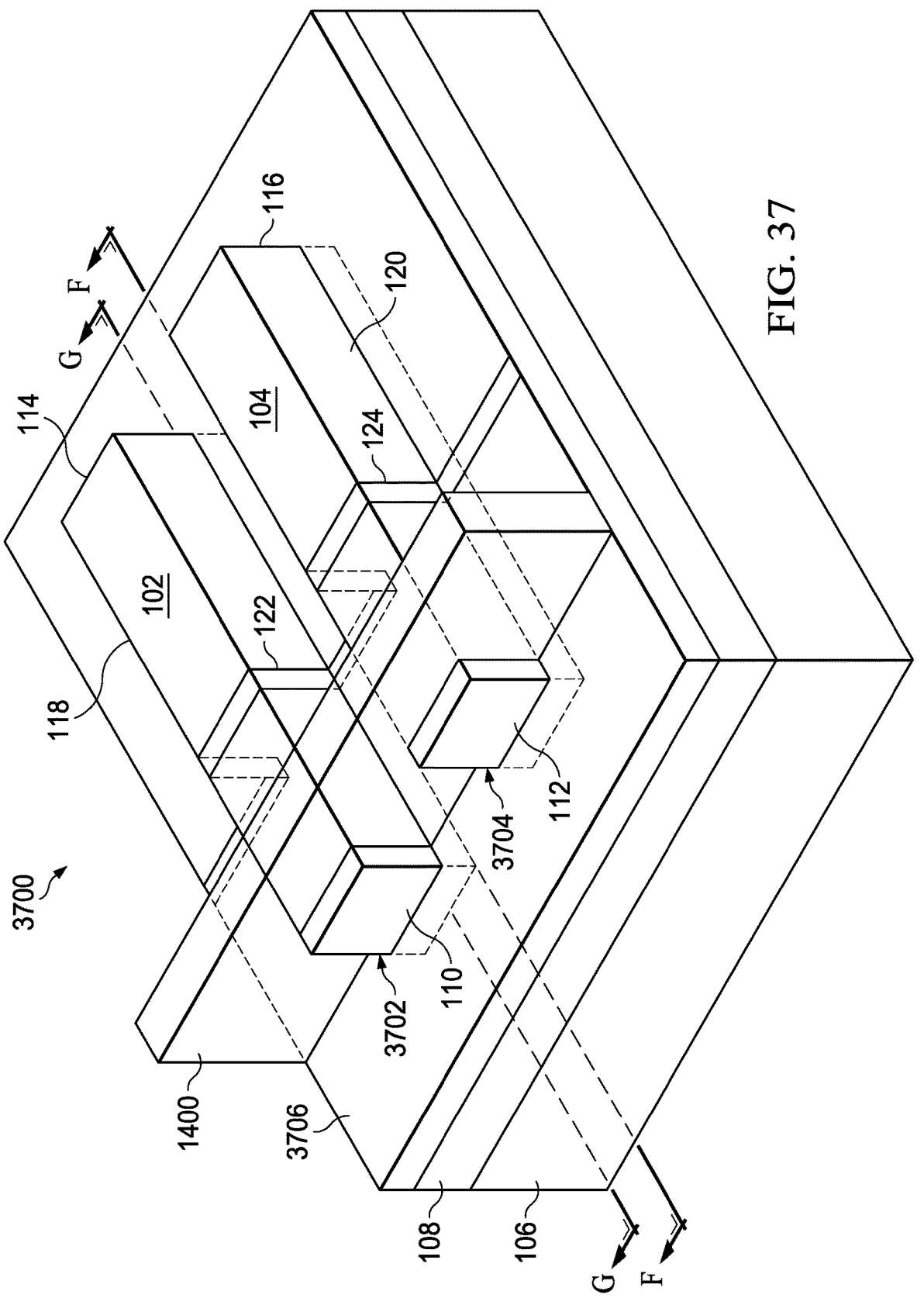
FIG. 37 is an isometric view of an example fin transistor at an intermediate processing stage showing an oxide layer formed over the substrate.
Figure 38:
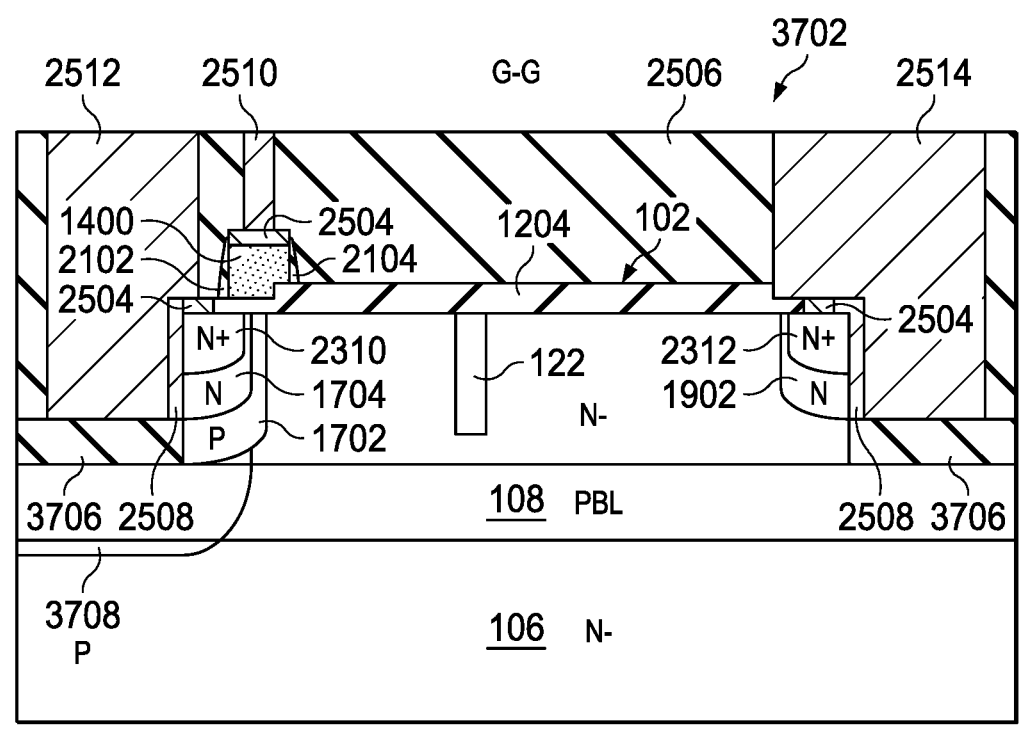
FIGS. 38 and 39 are cross-sectional views of a completed fin transistor according to the configuration of FIG. 37.
Figure 39:
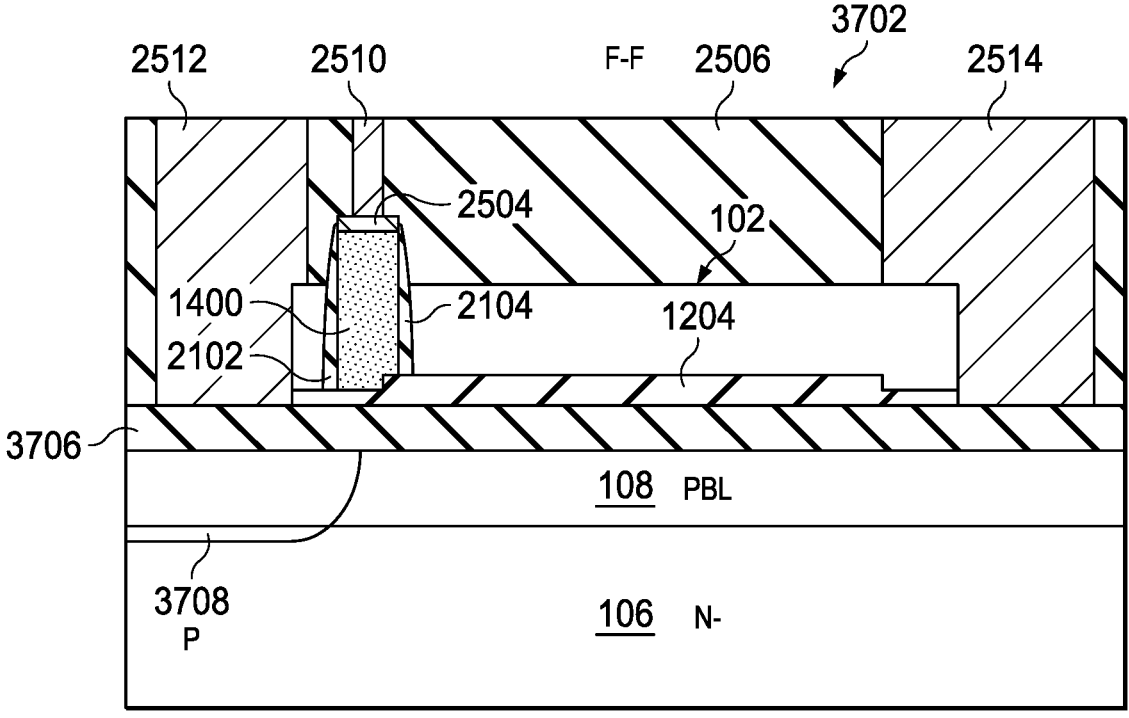

FIGS. 37, 38 and 39 depict another example of an IC 3700 that may include one or more fin transistors 3702, 3704. FIG. 37 is an isometric view of the IC at an intermediate fabrication stage for the fin transistors 3702 and 3704. FIGS. 38 and 39 are cross-sectional views of the completed fin transistor 3702 taken along the direction of lines F-F and G-G, respectively, in FIG. 37. The other fin transistor 3704 on the IC 3700 may have a similar configuration to the transistor 3702 shown in FIGS. 38 and 39.

As an example, the fin transistors 3702, 3704 may be formed according to the method 200 of FIG. 2. Thus, the same reference numbers in FIGS. 37, 38 and 39 refer to the features described with respect to FIGS. 3-26. The IC 3700 includes an oxide layer 3706 that is formed over the substrate 106. In the example method 200, the oxide layer 3706 can be formed after forming the fin 102, 104 (at 204), which further may be before or after forming the doped control layer 122, 124 (at 208). In another example, the oxide layer may be formed prior to forming channel, field and drift regions (at 207). In an example, the oxide layer 3706 may be formed by depositing a silicon dioxide layer that is polished and planarized to a desired thickness and then further etched back to recess it within the regions between fins. The oxide layer 3706 thus may be a field oxide layer configured to electrically isolate the respective fin transistors 3702, 3704 from other circuitry on the IC 3700. The oxide layer 3706 extends from a surface of the substrate 106 along a portion of the sidewalls 118, 120 of respective fins 102, 104. The oxide layer 3706 thus has a thickness that is less than a height of the fins 102, 104 (between the substrate surface and a top surface of the fins).

Additionally, as shown in FIGS. 38 and 39, the fin transistor 3702 also includes a deep implant region 3708 formed in the substrate 106 beneath the gate structure 1400 and source region 1702. The deep implant region may be formed prior to the oxide layer 3706. For example, the deep implant region 3506 is implanted with dopants having the same conductivity type as the source dopants implanted to form region 1702, which also are the same conductivity type as the buried doped layer 108 (and of an opposite conductivity type from dopants implanted to form source regions 1704 and 2310). For the example of an N-type fin transistor 3500, the deep implant region 3506 may be a P-type implant. The deep implant region 3506 may be coupled to commonly doped region 1702.

In the example shown in FIGS. 37-39, the fin transistors 3702, 3704 include a doped control layer 122, 124 formed along the sidewalls 118, 120 of the respective fins 102, 104. While the fin transistor 3704 is not shown in cross-sectional view of FIGS. 38 and 39, this description also refers to FIG. 37 for completeness in describing features of both fin transistors 3702, 3704. In an example where the oxide layer 3706 is formed prior to forming the doped control layers 122, 124, the oxide may block implanted dopants from penetrating into the substrate 106 as well as into a lower sidewall portion of the respective fins 102, 104. The fin transistors 3702, 3704 may also include the buried doped layer 108 formed in the substrate beneath the fins 102, 104. As described herein, the doped control layers 122, 124 and buried doped layer 108 may be implemented in various configurations, including being omitted, as described herein (see, e.g., FIGS. 27-36).

Figure 40:
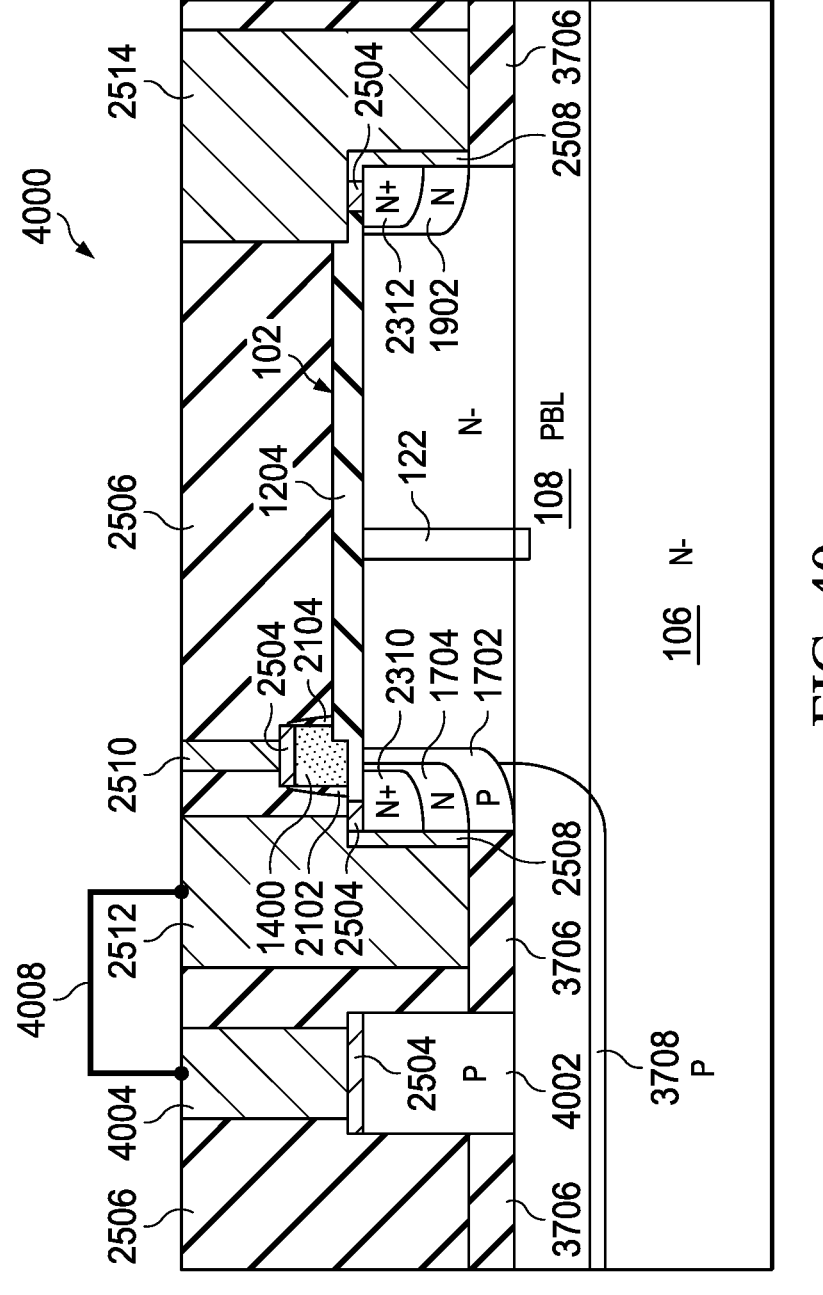
FIG. 40 is a cross-sectional view of an example fin transistor showing a connection between an extended source region and a doped control layer.

FIG. 40 depicts another example fin transistor 4000. The fin transistor 4000 may be formed according to the method 200 of FIG. 2. Thus, the description of FIG. 40 also refers to FIGS. 3-26 and FIG. 38. The fin transistor 4000 may be considered an alternative example embodiment of the fin transistor 3702 shown in FIGS. 37-39. For example, the source region of the fin transistor 4000 is extended to include a second fin structure 4002 formed on the substrate, such as prior to forming oxide layer 3706. The second fin 4002 may be implanted with dopants having the same conductivity type as the buried doped layer 108 (e.g., P-type dopants for N-type transistor and N-type dopants for a P-type transistor. Another metal contact 4004 is formed in PMD layer 2506 that is coupled to the buried doped layer 108 and to the deep implant region 3708 that extends beneath the doped fin 4002. The contact 4004 may be formed as part of same contact formation process used to form respective contacts 2510, 2512 and 2514 (see, e.g., FIGS. 25 and 26). The doped fin 4002 is configured to improve connectivity to deep implant region 3708 through the contact 4004.

As a further example, a connection, schematically shown at 4008, may be formed between the respective contacts 4004 and 2512. For example, the connection 4016 is implemented as a metal interconnect or a resistor (e.g., a polysilicon resistor) that is formed between contacts 4004 and 2512. In this way, a source voltage that is applied to the source contact 2512 (or a portion of such voltage) may be applied to the buried doped layer 108. In another example, the contact 4004 may be coupled to a different voltage source. The contact 4004 thus may operate as a second gate to control the flow of current through the fin channel during operation of the fin transistor 4000.

In some examples, a fin contact (not shown) could be formed in the fin transistor 4000 to couple to the doped control layer 122, such as through the PMD layer 2506 (e.g., at the top sidewall of the fin 102). In an example where the doped control layer along the fin includes multiple doped control regions (e.g., FIGS. 33 and 35), a connection may be made to respective contacts of one or more of such doped control regions.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, gates, sources, drains, conductive lines, conductive vias, etc. Moreover, the semiconductor die can be formed from a variety of processes including CMOS, BiCMOS, and LDMOS.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An integrated circuit (IC) comprising:
   a substrate of a semiconductor material having a top surface;
   a fin transistor comprising:
      a gate region;
      a source region including a source tap;
      a channel region formed between the gate and source regions;
      a drain region including a drain tap;
   a fin structure formed on or over the substrate, the fin structure including the gate region, the source region and a drift region between the channel region and the drain region, the source tap and drain tap spaced apart along the fin laterally with respect to the top surface; and
   a doped control layer formed along at least one sidewall of the fin structure over the drift region.

2. The IC of claim 1, wherein the doped control layer comprises a continuous doped region formed along each sidewall of the fin structure surrounding the drift region between the channel region and the drain region.

3. The IC of claim 1, wherein the doped control layer includes edges spaced apart from each other along a length of the fin structure, a width of the doped control layer between the spaced apart edges is less than a distance between the channel region and the drain region.

4. The IC of claim 1, wherein the doped control layer comprises a plurality of doped control regions spaced apart from each other along the fin structure between the channel region and the drain region.

5. The IC of claim 1, wherein the doped control layer further comprises a buried doped layer formed in the substrate beneath at least a portion of the fin structure.

6. The IC of claim 5, wherein the doped control layer formed along the at least one sidewall of the fin structure extends into the substrate to contact the buried doped layer.

7. The IC of claim 1, wherein the drift region of the fin structure has a first conductivity type and the doped control layer has a second opposite conductivity type.

8. The IC of claim 1, further comprising an oxide layer formed over the substrate, the oxide layer extending from a surface of the substrate along a portion of sidewalls of the fin structure to electrically isolate the fin transistor from other circuitry on the IC.

9. The IC of claim 1, further comprising:
   a fin contact coupled to the fin structure, the fin contact adapted to be coupled to a voltage source.

10. The IC of claim 9, further comprising:
   a source contact coupled to the source region; and
   a connector coupled between the fin contact and the source contact.

11. The IC of claim 1, wherein the fin transistor is a first fin transistor and the fin structure is a first fin structure, the IC further comprising:
   a second fin transistor comprising:

a second fin structure formed on the substrate spaced from the first fin structure, the second fin structure including:
      a second source region;
      a second gate region;
      a second channel region between the second source region and the second gate region;
      a second drain region; and
      a second drift region in the second fin structure between the second channel region and the second drain region; and
   a second doped control layer along at least a portion of the second drift region of the second fin transistor.

12. An integrated circuit (IC) comprising:
   a fin structure formed on a semiconductor substrate, the fin structure includes a fin transistor comprising:
      a source region formed in the fin structure;
      a drain region formed in the fin structure;
      a gate region formed in the fin structure between the source and drain regions;
      a channel region formed in the fin structure between the gate and source regions;
      a drift region formed in the fin structure between the channel and drain regions; and
   a buried doped layer that extends through the substrate beneath a first end of the fin structure and terminates in a distal end beneath an intermediate portion the fin structure located between the first end and a second end of the fin structure.

13. The IC of claim 12, wherein the buried doped layer is at least coextensive with and extends beneath the fin structure.

14. The IC of claim 12, further comprising a doped control layer along at least one sidewall of the fin structure over the drift region, the drift region formed in the fin structure between the channel and drain regions of the fin transistor, the doped control layer and the buried doped layer having a first conductivity type, and the drift region having a second opposite conductivity type.

15. The IC of claim 14, wherein the doped control layer comprises a continuous doped layer formed along each sidewall of the fin structure surrounding the drift region.

16. The IC of claim 14, wherein the doped control layer includes edges spaced apart from each other along a length of the fin structure, a width of the doped control layer between the spaced apart edges is less than a distance between the channel region and the drain region.

17. The IC of claim 14, further comprising:
   a contact coupled to at least one of the buried doped layer or the doped control layer, the contact adapted to be coupled to a voltage source.

18. The IC of claim 12, further comprising an oxide layer formed over the substrate, the oxide layer extending from a surface of the substrate along a portion of sidewalls of the fin structure to electrically isolate the fin transistor from other circuitry on the IC.

19. A method of making an integrated circuit (IC), comprising:
   forming a fin structure having respective ends laterally spaced apart along a longitudinal fin axis over a semiconductor substrate;
   forming a drift region in the fin structure extending between the respective ends of the fin structure between a channel region and a drain region of the fin structure;
   forming a doped control layer adjacent the drift region, the doped control layer extending over and/or beneath at least at least a portion of drift region; and forming a buried doped layer in the substrate extending beneath at least a portion of the drift region.

20. The method of claim 19, wherein forming the doped control layer comprises forming a doped control region along at least one sidewall of the fin structure over the drift region.

21. The method of claim 20, further comprising forming a contact coupled to at least one of the doped control region or the buried doped layer, the contact adapted to be coupled to a voltage source.

22. The method of claim 19, further comprising:

forming a gate region adjacent a first end of the fin structure;

forming a source region, the channel region located between the gate region and the source region; and forming the drain region adjacent a second end of the fin structure, the drift region in the fin structure extending between the channel region and the drain region.

23. The method of claim 22, wherein prior to forming the gate, source and drain regions, the method comprises:

forming an oxide layer over the substrate surface and surrounding the fin structure, the oxide layer extending from the substrate surface along a portion of sidewalls of the fin structure to electrically isolate the fin structure from other circuitry on the IC.

24. An integrated circuit (IC) comprising:

a semiconductor fin having a first conductivity type extending laterally along a longitudinal fin axis over a surface of a substrate between a source end and a drain end and having opposing sidewalls;

a drift region in the fin having the first conductivity type and extending between the source end and the drain end between the opposing sides;

a body region having an opposite second conductivity type between the source end and the drift region; and a gate electrode extending along a sidewall of the fin adjacent the body region.

25. The IC of claim 24, wherein the drift region extends a first length between the gate electrode and the drain end, and further comprising a doped region within the drift region that extends a shorter second distance between the gate electrode and the drain end, the doped region forming a junction with the drift region.

26. A method of making an integrated circuit (IC), comprising:

forming a fin structure having respective ends laterally spaced apart over a semiconductor substrate;

forming a drift region in the fin structure extending between the respective ends of the fin structure between a channel region and a drain region of the fin structure;

forming, adjacent the drift region, a doped control region along at least one sidewall of the fin structure over the drift region, the doped control region extending over and/or beneath at least at least a portion of drift region; and forming a buried doped layer in the substrate extending beneath at least a portion of the drift region.

* * * * *